United States Patent
Yamaji et al.

(10) Patent No.: US 12,091,430 B2
(45) Date of Patent: Sep. 17, 2024

(54) METAL SURFACE TREATMENT LIQUID AND LIQUID CONCENTRATE THEREOF, METAL SURFACE TREATMENT LIQUID SET, METAL SURFACE TREATMENT METHOD, AND METHOD FOR MANUFACTURING PRINTED WIRING BOARD

(71) Applicant: SHIKOKU CHEMICALS CORPORATION, Kagawa (JP)

(72) Inventors: Noriaki Yamaji, Kagawa (JP); Tatsuya Koga, Kagawa (JP); Hirohiko Hirao, Kagawa (JP)

(73) Assignee: SHIKOKU CHEMICALS CORPORATION, Kagawa (JP)

( * ) Notice: Subject to any disclaimer, the term of this patent is extended or adjusted under 35 U.S.C. 154(b) by 223 days.

(21) Appl. No.: 17/636,092

(22) PCT Filed: Sep. 1, 2020

(86) PCT No.: PCT/JP2020/033115
§ 371 (c)(1),
(2) Date: Feb. 17, 2022

(87) PCT Pub. No.: WO2021/045055
PCT Pub. Date: Mar. 11, 2021

(65) Prior Publication Data
US 2022/0306656 A1  Sep. 29, 2022

(30) Foreign Application Priority Data

Sep. 6, 2019  (JP) .................. 2019-163233
Dec. 27, 2019 (JP) .................. 2019-238922

(51) Int. Cl.
| C09D 183/08 | (2006.01) |
| C07F 7/18 | (2006.01) |
| C23C 22/52 | (2006.01) |
| H05K 3/38 | (2006.01) |

(52) U.S. Cl.
CPC ............ C07F 7/1804 (2013.01); C23C 22/52 (2013.01); H05K 3/382 (2013.01); C09D 183/08 (2013.01)

(58) Field of Classification Search
CPC .............................. C23C 22/52; C09D 183/08
USPC ..................................... 106/287.11
See application file for complete search history.

(56) References Cited

U.S. PATENT DOCUMENTS

| 5,037,482 A | 8/1991 | Kukanskis et al. |
| 2002/0192460 A1 | 12/2002 | Kawaguchi et al. |
| 2008/0264900 A1 | 10/2008 | Feng et al. |
| 2012/0021232 A1 | 1/2012 | Hack et al. |
| 2019/0127606 A1 | 5/2019 | Akiyama et al. |
| 2020/0031852 A1* | 1/2020 | Murai ...................... H01L 24/19 |
| 2020/0223875 A1 | 7/2020 | Yamaji et al. |
| 2022/0017755 A1 | 1/2022 | Morikawa et al. |

FOREIGN PATENT DOCUMENTS

| JP | H02-93079 | 4/1990 |
| JP | H04-218686 | 8/1992 |
| JP | H10-88104 | 4/1998 |
| JP | 2002-321310 | 11/2002 |
| JP | 2004-363364 | 12/2004 |
| JP | 2010-525175 | 7/2010 |
| JP | 2016-017221 | 2/2016 |
| JP | 2016-56449 | 4/2016 |
| JP | 2018-016865 | 2/2018 |
| JP | 2018-115306 | 7/2018 |
| JP | 2018-172759 | 11/2018 |
| JP | 2022-020415 | 2/2022 |
| WO | WO 2009/110364 | 9/2009 |
| WO | WO 2011/043236 | 4/2011 |
| WO | WO 2018/186476 | 10/2018 |
| WO | WO-2018186476 A1 * | 10/2018 ............. B32B 15/08 |
| WO | WO 2019/058773 | 3/2019 |

OTHER PUBLICATIONS

Extended Search Report for European Patent Application No. 20861657.3, dated Sep. 4, 2023, 9 pages.
English Translation of the International Preliminary Report on Patentability for International (PCT) Patent Application No. PCT/JP2020/033115, dated Mar. 8, 2022, 4 pages.
Official Action for Singapore Patent Application No. 11202200884X, dated Dec. 1, 2023, 8 pages.
Official Action for India Patent Application No. 202217005287, dated Jun. 26, 2023, 7 pages.
Official Action with English Translation for China Patent Application No. 202080062263.9, dated Sep. 26, 2023, 29 pages.
Official Action with Machine Translation for Japan Patent Application No. 2021-543781, dated Oct. 17, 2023, 6 pages.
Official Action with Machine Translation for Taiwan Patent Application No. 109129809, dated Oct. 5, 2023, 32 pages.
International Search Report and Written Opinion for International (PCT) Patent Application No. PCT/JP2020/033115, dated Nov. 2, 2020, 6 pages.
English Translation of the International Search Report for International (PCT) Patent Application No. PCT/JP2020/033115, dated Nov. 2, 2020, 2 pages.

* cited by examiner

Primary Examiner — Margaret G Moore
(74) Attorney, Agent, or Firm — Sheridan Ross P.C.

(57) ABSTRACT

The present invention provides a surface treatment liquid for metal having a sufficiently high film-forming property. The present invention relates to a surface treatment liquid for metal comprising an azole silane coupling agent, the surface treatment liquid further comprises (A) an organic acid ion having one to three acidic groups in one molecule; (B) an inorganic acid (or mineral acid) ion; (C) an alkali metal ion and/or an ammonium ion; and (D) a copper ion.

19 Claims, 1 Drawing Sheet

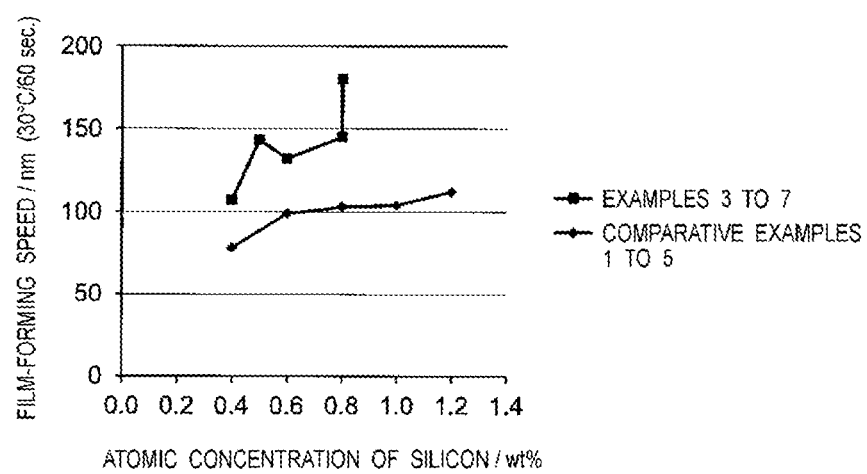

METAL SURFACE TREATMENT LIQUID AND LIQUID CONCENTRATE THEREOF, METAL SURFACE TREATMENT LIQUID SET, METAL SURFACE TREATMENT METHOD, AND METHOD FOR MANUFACTURING PRINTED WIRING BOARD

CROSS REFERENCE TO RELATED APPLICATIONS

This application is a national stage application under 35 U.S.C. 371 and claims the benefit of PCT Application No. PCT/JP2020/033115 having an international filing date of 1 Sep. 2020, which designated the United States, which PCT application claimed the benefit of Japanese Patent Application No. 2019-163233 filed 6 Sep. 2019 and Japanese Patent Application No. 2019-238922 filed 27 Dec. 2019, the disclosures of each of which are hereby incorporated herein by reference, in their entireties, for all that they teach and for all purposes.

TECHNICAL FIELD

The present invention relates to a surface treatment liquid for metal (particularly copper) and a liquid concentrate thereof, a surface treatment liquid set and a surface treatment method for metal, and a method for manufacturing a printed wiring board.

BACKGROUND ART

In recent years, when a surface of a metal circuit (for example, a copper circuit) of a printed wiring board and an insulating resin layer are brought into close contact with each other, it is required to bring a smooth copper surface and an insulating resin into close contact with each other in order to cope with high-speed transmission. In such a printed wiring board, it is a problem to secure adhesiveness between a metal circuit and an insulating resin layer.

For this reason, attempts have been made to improve the adhesiveness between the metal circuit and the insulating resin layer by an anchor effect obtained by roughening the surface of the metal circuit. However, when the adhesiveness between the metal circuit and the insulating resin layer is secured only by the anchor effect, electrical characteristics are deteriorated by a skin effect.

Therefore, a technique has been proposed in which a chemical film is formed on a surface of a metal circuit to improve adhesiveness between the metal circuit and an insulating resin layer (for example, Patent Literatures 1 to 3).

CITATIONS LIST

Patent Literatures

Patent Literature 1: WO 2018/186476 A1
Patent Literature 2: JP 2004-363364 A
Patent Literature 3: WO 2009/110364 A1

SUMMARY OF INVENTION

Problems to be Solved by the Invention

The inventors of the present invention have found that since the surface treatment liquid in the conventional technique as described above has a relatively low film-forming property (that is, film-forming speed of a chemical film), a chemical film having a sufficient thickness cannot be formed within a predetermined time, and as a result, adhesiveness between the metal circuit and the insulating resin layer cannot be sufficiently secured.

An object of the present invention is to provide a surface treatment liquid for metal having a sufficiently high film-forming property.

In the present invention, the "film-forming property" means a performance related to the film-forming speed of a chemical film.

Means for Solving Problems

The present invention relates to:
a surface treatment liquid for metal containing an azole silane coupling agent,
the surface treatment liquid further containing:
(A) an organic acid ion having one to three acidic groups in one molecule;
(B) an inorganic acid (or mineral acid) ion;
(C) an alkali metal ion and/or an ammonium ion; and
(D) a copper ion.
The present invention also relates to
a liquid concentrate of a surface treatment liquid for metal, containing an azole silane coupling agent,
the liquid concentrate further containing an organic acid ion (A); an inorganic acid ion (B); an alkali metal ion and/or ammonium ion (C); and a copper ion (D),
in which an atomic concentration of silicon contained in the liquid concentrate is in a range of 0.10 to 1.00% by weight.
The present invention also relates to
a surface treatment liquid set for metal, containing a first liquid and a second liquid, for producing a surface treatment liquid for metal containing an azole silane coupling agent, an organic acid ion (A), an inorganic acid ion (B), an alkali metal ion and/or an ammonium ion (C), and a copper ion (D) by mutual mixing of the first liquid and the second liquid, in which
the azole silane coupling agent is contained in the first liquid,
the organic acid ion (A), the inorganic acid ion (B), the alkali metal ion and/or ammonium ion (C), and the copper ion (D) are each independently contained in the first liquid and/or second liquid, and
an atomic concentration of silicon contained in the first liquid is in a range of 0.033 to 1.00% by weight.
The present invention also relates to a method for producing a surface treatment liquid for metal, including combining an azole silane coupling agent, an organic acid compound (a), an inorganic acid compound (b), an alkali metal compound (c1) and/or an ammonium compound (c2), a copper compound (d) (and optionally other components), and water.
The present invention also relates to a surface treatment method for metal, including bringing the surface treatment liquid for metal into contact with a surface of a metal.
The present invention also relates to a method for manufacturing a printed wiring board, comprising bringing the surface treatment liquid for metal into contact with a surface of a metal circuit of a printed wiring board to form a chemical film.
A specific summary of preferred embodiments of the surface treatment liquid according to the present invention is as follows:

<1> A surface treatment liquid for metal containing an azole silane coupling agent, the surface treatment liquid further containing a formate ion, a sulfate ion, a sodium ion, and a copper ion.

<2> The surface treatment liquid for metal according to <1>, in which an atomic concentration of silicon contained in the surface treatment liquid is in a range of 0.030 to 0.10% by weight (that is, from 0.011 to 0.036 mol/kg).

<3> The surface treatment liquid for metal according to <1> or <2>, in which the formate ion contained in the surface treatment liquid has a concentration in a range of 2.50 to 10.0% by weight (that is, from 0.56 to 2.22 mol/kg).

<4> The surface treatment liquid for metal according to any one of <1> to <3>, in which the sulfate ion contained in the surface treatment liquid has a concentration in a range of 0.30 to 3.00% by weight (that is, from 0.031 to 0.31 mol/kg).

<5> The surface treatment liquid for metal according to any one of <1> to <4>, in which the sodium ion contained in the surface treatment liquid has a concentration in a range of 1.50 to 6.00% by weight (that is, from 0.65 to 2.61 mol/kg).

<6> The surface treatment liquid for metal according to any one of <1> to <5>, in which the copper ion contained in the surface treatment liquid has a concentration in a range of 0.008 to 0.100% by weight (that is, from 0.0013 to 0.016 mol/kg).

Effects of the Invention

The surface treatment liquid for metal according to the present invention has a sufficiently high film-forming property.

BRIEF DESCRIPTION OF DRAWING

FIG. 1 is a graph showing a relationship between an atomic concentration of silicon and a film-forming speed in Examples and Comparative Examples shown in Table 2A and Table 2B.

MODES FOR CARRYING OUT THE INVENTION

[Surface Treatment Liquid for Metal]

A surface treatment liquid for metal according to the present invention is an aqueous solution containing an azole silane coupling agent and further containing the following ions:

(A) An organic acid ion having one to three acidic groups in one molecule (herein also referred to as "organic acid ion (A)");

(B) an inorganic acid (or mineral acid) ion (herein also referred to as "inorganic acid ion (B)");

(C) an alkali metal ion and/or an ammonium ion (herein also referred to as "alkali ion (C)"); and (D) a copper ion (herein also referred to as "copper ion (D)").

The surface treatment liquid of the present invention exhibits a sufficiently high film-forming property by containing an azole silane coupling agent and the ions (A) to (D). Details of the phenomenon are not clear, and are not bound by a specific theory, but are considered to be based on the following mechanism. Specifically, the surface treatment liquid of the present invention contains an azole silane coupling agent for forming a chemical film and the copper ion (D) that plays an auxiliary role in formation of the chemical film in the presence of the ions (A) to (C), thereby achieving the following promotion:

(1) The dissolution of the azole silane coupling agent by the organic acid ion (A) is promoted; and (2) when the chemical film is formed by the azole silane coupling agent, the formation of the chemical film is promoted by a salting-out effect by the inorganic acid ion (B) and the alkali ion (C).

As a result of these, when a metal (for example, copper) surface is treated (for example, immersed) using the surface treatment liquid of the present invention, the formation of the chemical film is synergistically promoted to more sufficiently enhance the film-forming property, and a sufficiently thick chemical film is thus more quickly obtained. When the film thickness of the chemical film increases, the amount of the azole silane coupling agent increases on the metal surface, so that the chemical film uniformly and continuously covers the metal surface. Thus, when a resin layer is further formed on the chemical film, the number of reaction points at which the resin layer can be bonded in the chemical film increases, so that an effect of obtaining stronger adhesion between the metal surface and the resin layer is obtained. In addition, since the chemical film becomes thick, an effect of suppressing permeation of oxygen when heat is applied in the subsequent step is enhanced, and oxidation of the metal surface is more sufficiently suppressed, so that the effect of enhancing heat resistance and oxidation resistance can also be obtained.

Azole Silane Coupling Agent as First Component

The azole silane coupling agent is a main substance that forms a chemical film on a metal surface.

The azole silane coupling agent is one or more kinds of azole silane compounds selected from the group consisting of a monoazole silane compound, a diazole silane compound, a triazole silane compound, and a tetrazole silane compound. In the present invention, from the viewpoint of further improving the film-forming property, the azole silane coupling agent preferably contains one or more kinds of azole silane compounds selected from the group consisting of a triazole silane compound and a tetrazole silane compound, and more preferably contains a triazole silane compound.

(Triazole Silane Compound)

The triazole silane compound is a compound having one silyl group-containing alkyl group (for example, a $-(CH_2)_m-Si(OR)_{3-n}(OH)_n$ group in general formula (Ia) to be described later) in one molecule as a substituent in a 5-membered heterocyclic compound containing three nitrogen atoms (that is, a triazole compound). The atom to which the silyl group-containing alkyl group is bonded is an atom constituting a triazole ring, and may be, for example, a nitrogen atom or a carbon atom. The atom to which the silyl group-containing alkyl group is bonded is preferably a nitrogen atom from the viewpoint of further improving the film-forming property. The triazole ring constituting the triazole silane compound may be a 1,2,4-triazole ring or a 1,2,3-triazole ring. The triazole ring is preferably a 1,2,4-triazole ring from the viewpoint of further improving the film-forming property.

Specific examples of the triazole silane compound include triazole silane compounds represented by general formulae (Ia) and (Ib). The compounds represented by general formulae (Ia) and (Ib) may be referred to as a triazole silane compound (Ia) and a triazole silane compound (Ib), respectively.

[Chem. 1]

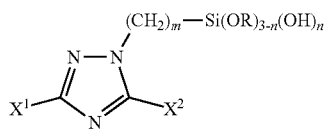
(Ia)

In formula (Ia), $X^1$ and $X^2$ each independently represent a hydrogen atom, a linear or branched alkyl group having 1 to 12 carbon atoms, a phenyl group, a benzyl group, an amino group, or an alkylthio group having 1 to 6 carbon atoms. Specific examples of the alkyl group include, for example, a methyl group, an ethyl group, an n-propyl group, an isopropyl group, an n-butyl group, an isobutyl group, a sec-butyl group, a tert-butyl group, an n-pentyl group, an n-hexyl group, an n-heptyl group, an n-octyl group, an n-nonyl group, an n-decyl group, an n-undecyl group, and an n-dodecyl group. Specific examples of the alkylthio group include, for example, a methylthio group, an ethylthio group, an n-propylthio group, an isopropylthio group, an n-butylthio group, an isobutylthio group, a sec-butylthio group, a tert-butylthio group, an n-pentylthio group, an n-hexylthio group. $X^1$ and $X^2$ may be the same or different, and are preferably the same. $X^1$ and $X^2$ each independently preferably represent a hydrogen atom, a linear or branched alkyl group having 1 to 12 carbon atoms (particularly a linear or branched alkyl group having 1 to 8 carbon atoms), a phenyl group, or an amino group, more preferably represent a hydrogen atom, a linear or branched alkyl group having 1 to 5 carbon atoms, or an amino group, and still more preferably represent an amino group, from the viewpoint of further improving the film-forming property.

In formula (Ia), m represents an integer of 1 to 12. m represents an integer of preferably 1 to 10, more preferably 1 to 5, and still more preferably 2 to 5 from the viewpoint of improving the solubility of the azole silane compound and further improving the film-forming property.

In formula (Ia), n represents an integer of 0 to 3.

In formula (Ia), R represents a methyl group or an ethyl group. R preferably represents an ethyl group from the viewpoint of improving the working environment.

[Chem. 2]

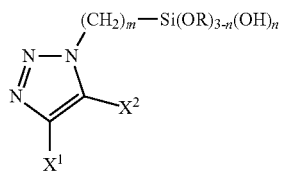
(Ib)

In formula (Ib), $X^1$, $X^2$, m, n, and R are the same as $X^1$, $X^2$, m, n, and R in formula (Ia), respectively.

In formula (Ib), $X^1$ and $X^2$ each independently preferably represent a hydrogen atom, a linear or branched alkyl group having 1 to 12 carbon atoms (particularly a linear or branched alkyl group having 1 to 8 carbon atoms), a phenyl group, or an amino group, more preferably represent a hydrogen atom, a linear or branched alkyl group having 1 to 5 carbon atoms, or an amino group, and still more preferably represent a hydrogen atom, from the viewpoint of further improving the film-forming property.

In formula (Ib), m represents an integer of preferably 1 to 10, more preferably 1 to 5, and still more preferably 2 to 5 from the viewpoint of improving the solubility of the azole silane compound and further improving the film-forming property.

In formula (Ib), n represents an integer of 0 to 3.

In formula (Ib), R represents a methyl group or an ethyl group. R preferably represents an ethyl group from the viewpoint of improving the working environment.

The triazole silane compound (Ia) includes triazole silane compounds represented by general formulae (Ia-1) to (Ia-4). The compounds represented by general formulae (Ia-1) to (Ia-4) may be referred to as a triazole silane compound (Ia-1), a triazole silane compound (Ia-2), a triazole silane compound (Ia-3), and a triazole silane compound (Ia-4), respectively.

[Chem. 3]

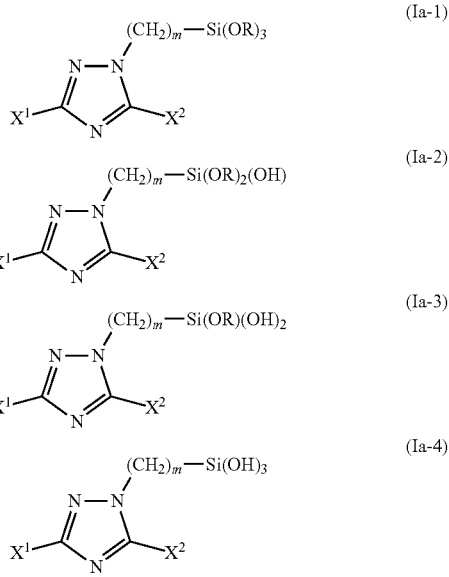

In formulae (Ia-1) to (Ia-4), $X^1$, $X^2$, m, and R are the same as $X^1$, $X^2$, m, and R in formula (Ia), respectively. In formulae (Ia-1) to (Ia-4), preferred $X^1$, $X^2$, m, and R are also the same as preferred $X^1$, $X^2$, m, and R in formula (Ia), respectively.

The triazole silane compound (Ia-1) is a triazole silane compound (trialkoxy form) when n is 0 in general formula (Ia).

Similarly, the triazole silane compound (Ia-2) is a triazole silane compound when n is 1, the triazole silane compound (Ia-3) is a triazole silane compound when n is 2, and the triazole silane compound (Ia-4) is a triazole silane compound when n is 3.

Specific examples of the triazole silane compound (Ia) include, for example, triazole silane compounds (Ia-1) exemplified below, and triazole silane compounds (Ia-2) to (Ia-4) formed by hydrolyzing (or converting) one to three alkoxy groups (for example, methoxy groups and/or ethoxy groups) into hydroxyl groups in the triazole silane compound (Ia-1):

1-[3-(trimethoxysilyl)propyl]-1,2,4-triazole,
1-[3-(triethoxysilyl)propyl]-1,2,4-triazole,
3-methyl-1-[2-(triethoxysilyl)ethyl]-1,2,4-triazole,
5-methyl-1-[4-(trimethoxysilyl)butyl]-1,2,4-triazole,
3-ethyl-1-[3-(trimethoxysilyl)propyl]-1,2,4-triazole, 3-propyl-1-[3-(trimethoxysilyl)propyl]-1,2,4-triazole,
3-isopropyl-1-[10-(trimethoxysilyl)decyl]-1,2,4-triazole,
3-butyl-1-[3-(trimethoxysilyl)propyl]-1,2,4-triazole,
3-hexyl-1-[3-(trimethoxysilyl)propyl]-1,2,4-triazole,
5-methyl-3-octyl-1-[3-(trimethoxysilyl)propyl]-1,2,4-triazole,
3-dodecyl-1-[6-(triethoxysilyl)hexyl]-1,2,4-triazole,
3,5-dimethyl-1-[3-(trimethoxysilyl)propyl]-1,2,4-triazole,
3,5-diisopropyl-1-[3-(triethoxysilyl)propyl]-1,2,4-triazole,
3-phenyl-1-[3-(trimethoxysilyl)propyl]-1,2,4-triazole,
3-methyl-5-phenyl-1-[3-(trimethoxysilyl)propyl]-1,2,4-triazole,
3-ethyl-5-phenyl-1-[3-(trimethoxysilyl)propyl]-1,2,4-triazole,
3,5-diphenyl-1-[3-(triethoxysilyl)propyl]-1,2,4-triazole,
3-benzyl-1-[4-(triethoxysilyl)butyl]-1,2,4-triazole,
3-benzyl-5-phenyl-1-[3-(triethoxysilyl)propyl]-1,2,4-triazole,
3-hexylthio-1-[3-(triethoxysilyl)propyl]-1,2,4-triazole,
3-benzyl-5-propyl-1-[6-(triethoxysilyl)hexyl]-1,2,4-triazole,
3-amino-1-(triethoxysilyl)methyl-1,2,4-triazole,
3-amino-1-[2-(trimethoxysilyl)ethyl]-1,2,4-triazole,
3-amino-1-[3-(trimethoxysilyl)propyl]-1,2,4-triazole,
5-amino-1-[3-(triethoxysilyl)propyl]-1,2,4-triazole,
5-amino-3-ethyl-1-[6-(trimethoxysilyl)hexyl]-1,2,4-triazole,
3-amino-5-phenyl-1-[3-(triethoxysilyl)propyl]-1,2,4-triazole,
3-amino-5-benzyl-1-[3-(triethoxysilyl)propyl]-1,2,4-triazole,
3-amino-1-[6-(trimethoxysilyl)hexyl]-1,2,4-triazole,
3-amino-1-[6-(triethoxysilyl)hexyl]-1,2,4-triazole,
3-amino-1-[12-(trimethoxysilyl)dodecyl]-1,2,4-triazole,
3,5-diamino-1-[1-(trimethoxysilyl)methyl]-1,2,4-triazole,
3,5-diamino-1-[1-(triethoxysilyl)methyl]-1,2,4-triazole,
3,5-diamino-1-[3-(trimethoxysilyl)propyl]-1,2,4-triazole,
3,5-diamino-1-[3-(triethoxysilyl)propyl]-1,2,4-triazole,
3,5-diamino-1-[6-(trimethoxysilyl)hexyl]-1,2,4-triazole,
3,5-diamino-1-[12-(trimethoxysilyl)dodecyl]-1,2,4-triazole,
3-methylthio-1-[3-(trimethoxysilyl)propyl]-1,2,4-triazole,
3-isopropylthio-1-[3-(trimethoxysilyl)propyl]-1,2,4-triazole,
3-hexylthio-1-[10-(triethoxysilyl)decyl]-1,2,4-triazole,
3-ethylthio-5-isopropyl-1-[3-(triethoxysilyl)propyl]-1,2,4-triazole,
3,5-bis(methylthio)-1-[3-(trimethoxysilyl)propyl]-1,2,4-triazole,
5-hexylthio-3-methylthio-1-[3-(trimethoxysilyl)propyl]-1,2,4-triazole,
3-amino-5-methylthio-1-[3-(triethoxysilyl)propyl]-1,2,4-triazole,
5-amino-3-methylthio-1-[3-(trimethoxysilyl)propyl]-1,2,4-triazole,
5-amino-3-methylthio-1-[3-(triethoxysilyl)propyl]-1,2,4-triazole,
5-amino-3-isopropylthio-1-[6-(triethoxysilyl)hexyl]-1,2,4-triazole,
3-amino-5-hexylthio-1-[3-(triethoxysilyl)propyl]-1,2,4-triazole, and the like.

Among the triazole silane compounds (Ia), the triazole silane compound (Ia-1) can be synthesized in accordance with WO 2018/186476, US 2012/0021232 A, and WO 2019/058773. Specifically, as shown in the following reaction scheme (E), the triazole silane compound (Ia-1) can be synthesized in a substantially high yield by allowing a triazole compound (herein also referred to as a triazole compound (Ia-x)) represented by general formula (Ia-x) to react with a halogenated alkylsilane compound (herein also referred to as a halogenated alkylsilane compound (Ia-y)) represented by general formula (Ia-y) in an appropriate amount of a reaction solvent in the presence of a dehydrohalogenating agent at an appropriate reaction temperature for an appropriate reaction time.

[Chem. 4]

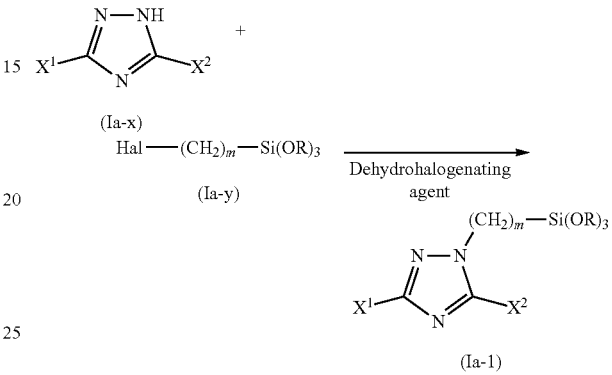

In the reaction scheme (E), $X^1$, $X^2$, m, and R are the same as $X^1$, $X^2$, m, and R in formula (Ia), respectively.

The reaction solvent is not particularly limited as long as it is a solvent inert to the triazole compound (Ia-x) and the halogenated alkylsilane compound (Ia-y), and examples thereof include the following solvents:

Hydrocarbon solvents such as hexane, toluene, and xylene;
  ether solvents such as diethyl ether, tetrahydrofuran, dioxane, and cyclopentyl methyl ether;
  ester solvents such as ethyl acetate and butyl acetate;
  alcohol solvents such as methanol and ethanol;
  amide solvents such as N,N-dimethylformamide, N,N-dimethylacetamide, and N-methylpyrrolidone;
  ketone solvents such as acetone, methyl ethyl ketone, methyl isobutyl ketone, and cyclohexanone;
  acetonitrile, dimethylsulfoxide, and hexamethylphosphoramide.

Examples of the dehydrohalogenating agent include the following compounds:
  Alkali metal alkoxides such as sodium methoxide, sodium ethoxide, potassium methoxide, and potassium t-butoxide;
  alkali carbonates such as sodium carbonate, sodium hydrogen carbonate, and potassium hydrogen carbonate;
  organic bases such as diazabicycloundecene; and sodium hydride.

The reaction between the triazole compound (Ia-x) and the halogenated alkylsilane compound (Ia-y) proceeds stoichiometrically as shown in the reaction scheme (E), but the use amount (charged amount) of the halogenated alkylsilane compound (Ia-y) with respect to the use amount (charged amount) of the triazole compound (Ia-x) is preferably set to an appropriate ratio in a range of 0.8 to 1.2 times by mole in consideration of the factors such as the kinds of starting materials and reaction solvent used and the reaction scale, as well as the reaction temperature and the reaction time. When the charged amount of the halogenated alkylsilane compound (Ia-y) is more than 1.2 times by mole, the compound may be polymerized to form a gel, whereas when the charged amount is less than 0.8 times by mole, purity of the product may be reduced, or separation operation of the product may be cumbersome.

Since the dehydrohalogenating agent is used for the purpose of neutralizing hydrogen halide by-produced by the reaction of the triazole compound (Ia-x) with the halogenated alkylsilane compound (Ia-y), the use amount (charged amount) thereof may be equimolar or more with respect to the use amount of the halogenated alkylsilane compound (Ia-y).

The reaction temperature is not particularly limited as long as it is in a temperature range in which the NH at position 1 of the triazole compound (Ia-x) reacts with the halogenated alkylsilane compound (Ia-y), and is preferably in a range of 0 to 150° C., and more preferably in a range of 5 to 100° C.

The reaction time is appropriately determined according to the set reaction temperature, and is preferably in a range of 30 minutes to 10 hours, and more preferably in a range of 1 to 8 hours.

Among the triazole silane compounds (Ia), the triazole silane compounds (Ia-2) to (Ia-4) can be synthesized by bringing the triazole silane compound (Ia-1) of the trialkoxy form into contact with an appropriate amount of water to hydrolyze the compound.

The triazole silane compound (Ia) may be a mixture of the triazole silane compounds (Ia-1) to (Ia-4).

The triazole silane compound (Ib) includes triazole silane compounds represented by general formulae (Ib-1) to (Ib-4). The compounds represented by general formulae (Ib-1) to (Ib-4) may be referred to as a triazole silane compound (Ib-1), a triazole silane compound (Ib-2), a triazole silane compound (Ib-3), and a triazole silane compound (Ib-4), respectively.

[Chem. 5]

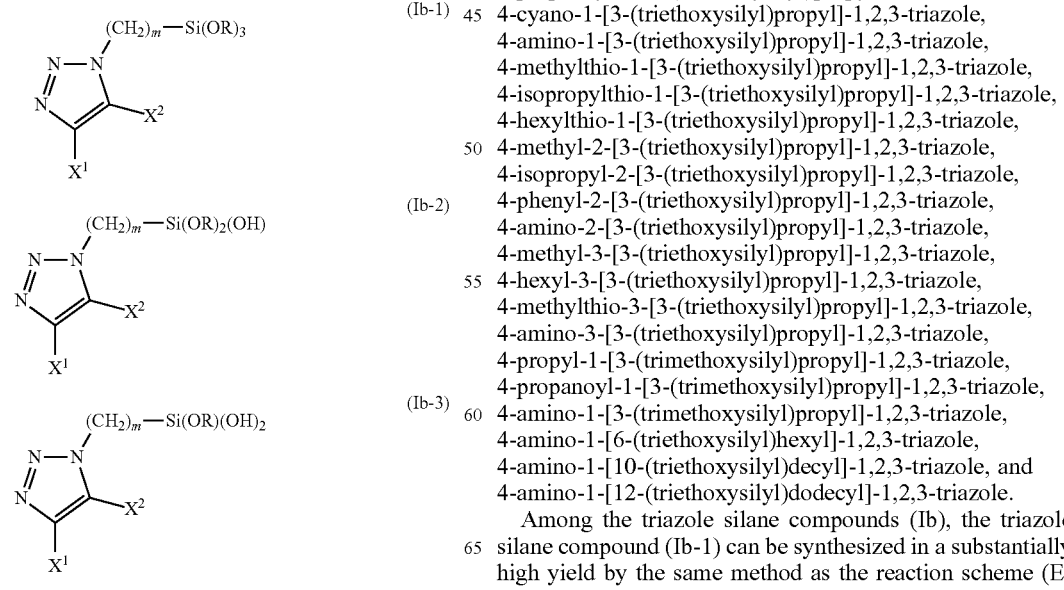

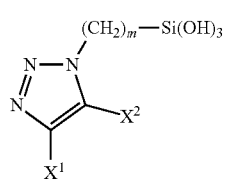

In formulae (Ib-1) to (Ib-4), $X^1$, $X^2$, m, and R are the same as $X^1$, $X^2$, m, and R in formula (Ia), respectively. In formulae (Ib-1) to (Ib-4), preferred $X^1$, $X^2$, m, and R are the same as preferred $X^1$, $X^2$, m, and R in formula (Ib), respectively.

The triazole silane compound (Ib-1) is a triazole silane compound (trialkoxy form) when n is 0 in general formula (Ib).

Similarly, the triazole silane compound (Ib-2) is a triazole silane compound when n is 1, the triazole silane compound (Ib-3) is a triazole silane compound when n is 2, and the triazole silane compound (Ib-4) is a triazole silane compound when n is 3.

Specific examples of the triazole silane compound (Ib) include, for example, triazole silane compounds (Ib-1) exemplified below, and triazole silane compounds (Ib-2) to (Ib-4) formed by hydrolyzing (or converting) one to three alkoxy groups (for example, methoxy groups and/or ethoxy groups) into hydroxyl groups in the triazole silane compound (Ib-1):

1-[3-(trimethoxysilyl)propyl]-1,2,3-triazole,
1-[3-(triethoxysilyl)propyl]-1,2,3-triazole,
4-methyl-1-[3-(triethoxysilyl)propyl]-1,2,3-triazole,
4-ethyl-1-[3-(triethoxysilyl)propyl]-1,2,3-triazole,
4-propyl-1-[3-(triethoxysilyl)propyl]-1,2,3-triazole,
4-isopropyl-1-[3-(triethoxysilyl)propyl]-1,2,3-triazole,
4-butyl-1-[3-(triethoxysilyl)propyl]-1,2,3-triazole,
4-hexyl-1-[3-(triethoxysilyl)propyl]-1,2,3-triazole,
4-dodecyl-1-[3-(triethoxysilyl)propyl]-1,2,3-triazole,
4,5-dimethyl-1-[3-(triethoxysilyl)propyl]-1,2,3-triazole,
4-benzyl-1-[3-(triethoxysilyl)propyl]-1,2,3-triazole,
4-phenyl-1-[3-(triethoxysilyl)propyl]-1,2,3-triazole,
4,5-diphenyl-1-[3-(triethoxysilyl)propyl]-1,2,3-triazole,
4-acetyl-1-[3-(triethoxysilyl)propyl]-1,2,3-triazole,
4-propanoyl-1-[3-(triethoxysilyl)propyl]-1,2,3-triazole,
4-cyano-1-[3-(triethoxysilyl)propyl]-1,2,3-triazole,
4-amino-1-[3-(triethoxysilyl)propyl]-1,2,3-triazole,
4-methylthio-1-[3-(triethoxysilyl)propyl]-1,2,3-triazole,
4-isopropylthio-1-[3-(triethoxysilyl)propyl]-1,2,3-triazole,
4-hexylthio-1-[3-(triethoxysilyl)propyl]-1,2,3-triazole,
4-methyl-2-[3-(triethoxysilyl)propyl]-1,2,3-triazole,
4-isopropyl-2-[3-(triethoxysilyl)propyl]-1,2,3-triazole,
4-phenyl-2-[3-(triethoxysilyl)propyl]-1,2,3-triazole,
4-amino-2-[3-(triethoxysilyl)propyl]-1,2,3-triazole,
4-methyl-3-[3-(triethoxysilyl)propyl]-1,2,3-triazole,
4-hexyl-3-[3-(triethoxysilyl)propyl]-1,2,3-triazole,
4-methylthio-3-[3-(triethoxysilyl)propyl]-1,2,3-triazole,
4-amino-3-[3-(triethoxysilyl)propyl]-1,2,3-triazole,
4-propyl-1-[3-(trimethoxysilyl)propyl]-1,2,3-triazole,
4-propanoyl-1-[3-(trimethoxysilyl)propyl]-1,2,3-triazole,
4-amino-1-[3-(trimethoxysilyl)propyl]-1,2,3-triazole,
4-amino-1-[6-(triethoxysilyl)hexyl]-1,2,3-triazole,
4-amino-1-[10-(triethoxysilyl)decyl]-1,2,3-triazole, and
4-amino-1-[12-(triethoxysilyl)dodecyl]-1,2,3-triazole.

Among the triazole silane compounds (Ib), the triazole silane compound (Ib-1) can be synthesized in a substantially high yield by the same method as the reaction scheme (E) except that the triazole compound (herein also referred to as a triazole compound (Ib-x)) represented by general formula (Ib-x) is used in place of the triazole compound (Ia-x).

[Chem. 6]

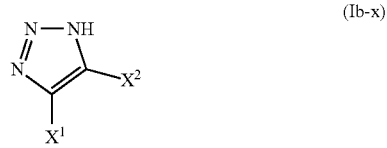

(Ib-x)

In formula (Ib-x), $X^1$ and $X^2$ are the same as $X^1$ and $X^2$ in formula (Ia), respectively.

Among the triazole silane compounds (Ib), the triazole silane compounds (Ib-2) to (Ib-4) can be synthesized by bringing the triazole silane compound (Ib-1) of the trialkoxy form into contact with an appropriate amount of water to hydrolyze the compound.

The triazole silane compound (Ib) may be a mixture of the triazole silane compounds (Ib-1) to (Ib-4).

(Monoazole Silane Compound)

The monoazole silane compound is a compound having one silyl group-containing alkyl group (for example, the same group as the —$(CH_2)_m$—$Si(OR)_{3-n}(OH)_n$ group in the general formula (Ia)) in one molecule as a substituent in a 5-membered heterocyclic compound containing one nitrogen atom (that is, a monoazole compound). The atom to which the silyl group-containing alkyl group is bonded is an atom constituting a monoazole ring, and may be, for example, a nitrogen atom or a carbon atom. The atom to which the silyl group-containing alkyl group is bonded is preferably a nitrogen atom from the viewpoint of further improving the film-forming property. The monoazole silane compound may further have a substituent (for example, the same groups as $X^1$ and $X^2$ in the general formula (Ia)). The atom to which the substituent is bonded is an atom constituting a monoazole ring, and may be, for example, a nitrogen atom or a carbon atom.

(Diazole Silane Compound)

The diazole silane compound is a compound having one silyl group-containing alkyl group (for example, the same group as the —$(CH_2)_m$—$Si(OR)_{3-n}(OH)_n$ group in general formula (Ia)) in one molecule as a substituent in a 5-membered heterocyclic compound containing two nitrogen atoms (that is, a diazole compound). The atom to which the silyl group-containing alkyl group is bonded is an atom constituting a diazole ring, and may be, for example, a nitrogen atom or a carbon atom. The atom to which the silyl group-containing alkyl group is bonded is preferably a nitrogen atom from the viewpoint of further improving the film-forming property. The diazole silane compound may further have a substituent (for example, the same groups as $X^1$ and $X^2$ in the general formula (Ia)). The atom to which the substituent is bonded is an atom constituting a diazole ring, and may be, for example, a nitrogen atom or a carbon atom.

(Tetrazole Silane Compound)

The tetrazole silane compound is a compound having one silyl group-containing alkyl group (for example, the same group as the —$(CH_2)_m$—$Si(OR)_{3-n}(OH)_n$ group in general formula (Ic) to be described later) in one molecule as a substituent in a 5-membered heterocyclic compound containing four nitrogen atoms (that is, a tetrazole compound). The atom to which the silyl group-containing alkyl group is bonded is an atom constituting a tetrazole ring, and may be, for example, a nitrogen atom or a carbon atom. The atom to which the silyl group-containing alkyl group is bonded is preferably a nitrogen atom from the viewpoint of further improving the film-forming property. The tetrazole silane compound may further have a substituent (for example, the same group as $X^1$ in the general formula (Ia)). The atom to which the substituent (for example, the same group as $X^1$ in the general formula (Ia)) is bonded is an atom constituting a tetrazole ring, and may be, for example, a nitrogen atom or a carbon atom. The atom to which the substituent (for example, the same group as $X^1$ in the general formula (Ia)) is bonded is preferably a carbon atom from the viewpoint of further improving the film-forming property.

Specific examples of the tetrazole silane compound include a tetrazole silane compound represented by general formula (Ic). The compound represented by general formula (Ic) may be referred to as a tetrazole silane compound (Ic).

[Chem. 7]

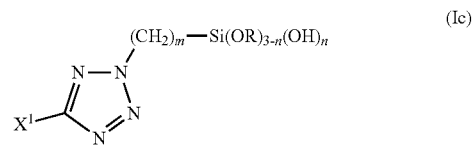

(Ic)

In formula (Ic), $X^1$, m, n, and R are the same as $X^1$, m, n, and R in formula (Ia), respectively.

In formula (Ic), $X^1$ preferably represents a hydrogen atom, a linear or branched alkyl group having 1 to 12 carbon atoms (particularly a linear or branched alkyl group having 1 to 8 carbon atoms), a phenyl group, or an amino group, more preferably represents a phenyl group or an amino group, and still more preferably represents an amino group, from the viewpoint of further improving the film-forming property.

In formula (Ic), m represents an integer of preferably 1 to 10, more preferably 1 to 5, and still more preferably 2 to 5 from the viewpoint of improving the solubility of the azole silane compound and further improving the film-forming property.

In formula (Ic), n represents an integer of 0 to 3.

In formula (Ic), R represents a methyl group or an ethyl group. R preferably represents an ethyl group from the viewpoint of improving the working environment and further improving the film-forming property.

In formula (Ic), the silyl group-containing alkyl group (that is, —$(CH_2)_m$—$Si(OR)_{3-n}(OH)_n$) is bonded to the nitrogen atom at position 2, but may be bonded to the nitrogen atom at position 1. Specifically, the tetrazole silane compound (Ic) represented by general formula (Ic) includes a tetrazole silane compound in which the silyl group-containing alkyl group is bonded to the nitrogen atom at position 1 in place of the nitrogen atom at position 2 in general formula (Ic).

The tetrazole silane compound (Ic) includes tetrazole silane compounds represented by general formulae (Ic-1) to (Ic-4). The compounds represented by general formulae (Ic-1) to (Ic-4) may be referred to as a tetrazole silane compound (Ic-1), a tetrazole silane compound (Ic-2), a tetrazole silane compound (Ic-3), and a tetrazole silane compound (Ic-4), respectively. In general formulae (Ic-1) to (Ic-4), the silyl group-containing alkyl group is bonded to the nitrogen atom at position 2, but may be bonded to the nitrogen atom at position 1 as in formula (Ic).

[Chem. 8]

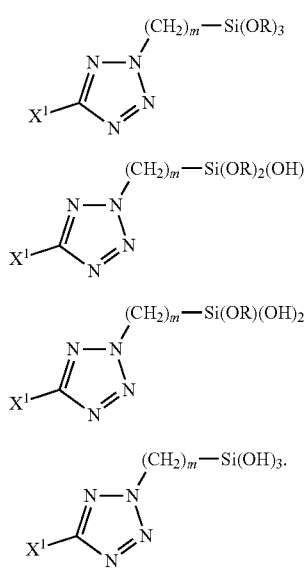

In formulae (Ic-1) to (Ic-4), $X^1$, m, and R are the same as $X^1$, m, and R in formula (Ia), respectively. In formulae (Ic-1) to (Ic-4), preferred $X^1$, m, and R are the same as preferred $X^1$, m, and R in formula (Ic), respectively.

In formulae (Ic-1) to (Ic-4), the silyl group-containing alkyl group (that is, $-(CH_2)_m-Si(OR)_{3-n}(OH)_n$) is bonded to the nitrogen atom at position 2, but may be bonded to the nitrogen atom at position 1. Specifically, each of the tetrazole silane compounds (Ic-1) to (Ic-4) represented by general formulae (Ic-1) to (Ic-4) respectively includes a tetrazole silane compound in which the silyl group-containing alkyl group is bonded to the nitrogen atom at position 1 in place of the nitrogen atom at position 2 in general formulae (Ic-1) to (Ic-4).

The tetrazole silane compound (Ic-1) is a tetrazole silane compound (trialkoxy form) when n is 0 in the general formula (Ic).

Similarly, the tetrazole silane compound (Ic-2) is a tetrazole silane compound when n is 1, the tetrazole silane compound (Ic-3) is a tetrazole silane compound when n is 2, and the tetrazole silane compound (Ic-4) is a tetrazole silane compound when n is 3.

Specific examples of the tetrazole silane compound (Ic) include, for example, tetrazole silane compounds (Ic-1) exemplified below, and tetrazole silane compounds (Ic-2) to (Ic-4) formed by hydrolyzing (or converting) one to three alkoxy groups (for example, methoxy groups and/or ethoxy groups) into hydroxyl groups in the tetrazole silane compound (Ic-1):

5-amino-2-[3-(trimethoxysilyl)propyl]-2H-tetrazole,
5-amino-1-[3-(trimethoxysilyl)propyl]-1H-tetrazole,
5-amino-2-[3-(triethoxysilyl)propyl]-2H-tetrazole,
5-amino-1-[3-(triethoxysilyl)propyl]-1H-tetrazole,
5-phenyl-2-[3-(trimethoxysilyl)propyl]-2H-tetrazole,
5-phenyl-1-[3-(trimethoxysilyl)propyl]-1H-tetrazole,
5-phenyl-2-[3-(triethoxysilyl)propyl]-2H-tetrazole, and
5-phenyl-1-[3-(triethoxysilyl)propyl]-1H-tetrazole.

Among the tetrazole silane compounds (Ic), the tetrazole silane compound (Ic-1) can be synthesized in a substantially high yield by the same method as the reaction scheme (E) except that the tetrazole compound (herein also referred to as a tetrazole compound (Ic-x)) represented by general formula (Ic-x) is used in place of the triazole compound (Ia-x).

[Chem. 9]

In formula (Ic-x), $X^1$ is the same as $X^1$ in formula (Ia).

Among the tetrazole silane compounds (Ic), the tetrazole silane compounds (Ic-2) to (Ic-4) can be synthesized by bringing the tetrazole silane compound (Ic-1) of the trialkoxy form into contact with an appropriate amount of water to hydrolyze the compound.

The tetrazole silane compound (Ic) may be a mixture of the tetrazole silane compounds (Ic-1) to (Ic-4).

(Hydrolysis and Concentration of Azole Silane Coupling Agent)

The azole silane coupling agent is hydrolyzed when brought into contact with water, as described above. An embodiment of this hydrolysis is shown in scheme (F). The scheme (F) indicates an embodiment where the silyl group included in the azole silane coupling agent is hydrolyzed, that is, an embodiment where the trialkoxysilyl group (a) is progressively changed to a dialkoxyhydroxysilyl group (b), a dihydroxyalkoxysilyl group (c), and a trihydroxysilyl group (d). X of the group represented by chemical formula (e) is an integer representing the number of repeating units. Specifically, some of the azole silane compounds (for example, the triazole silane compounds (Ia-2) to (Ia-4), triazole silane compounds (Ib-2) to (Ib-4), and tetrazole silane compounds (Ic-2) to (Ic-4) described above) having a hydroxysilyl group generated in the surface treatment liquid gradually react with each other to perform dehydration condensation, and the hydroxysilyl group may form a siloxane bond (Si—O—Si) (see chemical formula (e) in the scheme (F)) thereby being converted into a silane oligomer hardly soluble in water. When the amount of the silane oligomer generated in the surface treatment liquid increases, an insoluble matter is precipitated, the surface treatment liquid becomes cloudy, and the treated product may be contaminated. Therefore, it is preferable that the amount of silane oligomer produced in the surface treatment liquid is suppressed and the surface treatment liquid is clear.

[Chem. 10]

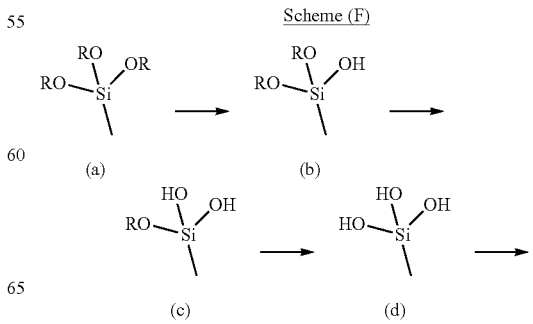

Scheme (F)

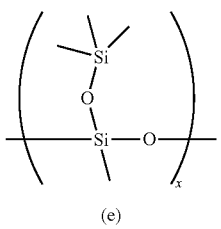

(e)

A substance having an alkoxysilyl group in a molecule is known to act as a silane coupling agent. Therefore, it is considered that the azole silane coupling agent exhibits the following action in the generation of the chemical film:

For example, when bonding between copper and a resin material is taken as an example, the azole silane coupling agent used in the practice of the present invention has an azole ring and an alkoxysilyl group (—Si—OR) in the molecule thereof, and the azole ring interacts with a resin and a metal (particularly copper) to form a chemical bond.

Also, the alkoxysilyl group is subjected to hydrolysis to be converted into a hydroxysilyl group (—Si—OH), and the hydroxysilyl group is chemically bonded to a metal oxide (particularly copper oxide) interspersed on a surface of a metal (particularly copper).

Therefore, by bringing the surface treatment liquid of the present invention into contact with the metal (particularly copper), a chemical film derived from the azole silane coupling agent is formed on the surface of the metal (particularly copper) due to the bonds of the azole ring and the hydroxysilyl group, and in the case of forming an insulating resin layer composed of a resin material on the surface of the chemical film, adhesiveness between the metal (particularly copper) and the resin material can be enhanced as compared with the case of directly forming the insulating resin layer on the surface of the metal (particularly copper).

The azole silane coupling agent in the surface treatment liquid usually has such a concentration that an atomic concentration of silicon contained in the surface treatment liquid is from 0.001 to 1.0% by weight. From the viewpoint of further improving the film-forming property, the azole silane coupling agent in the surface treatment liquid has such a concentration that the atomic concentration of silicon contained in the surface treatment liquid is preferably from 0.010 to 0.50% by weight, more preferably from 0.030 to 0.10% by weight, still more preferably from 0.040 to 0.090% by weight, and particularly preferably from 0.042 to 0.080% by weight. The atomic concentration of silicon is a ratio of weight of silicon atoms contained in the surface treatment liquid to the total weight of the surface treatment liquid. Pure water such as distilled water, ion-exchanged water, and purified water usually contains silicon atoms at a concentration of 0.0001% by weight or less. Therefore, in the case where the surface treatment liquid does not contain a compound (or additive) containing a silicon atom other than the silane coupling agent, the silicon atom contained in the surface treatment liquid can be estimated to be derived from the silane coupling agent. In such a case, when the atomic concentration of silicon contained in the surface treatment liquid is too low, the film-forming property is deteriorated. When the atomic concentration of the silicon is too high, the silicon is precipitated without being dissolved, and the effect of improving the film-forming property has almost reached its peak, and the amount of the azole silane coupling agent used is only increased, which is not economical. The numerical range herein is defined as a range comprehensively including its lower limit and upper limit unless otherwise specified.

The atomic concentration of silicon contained in the surface treatment liquid is usually from 0.0004 to 0.36 mol/kg, preferably from 0.0036 to 0.18 mol/kg, and more preferably from 0.011 to 0.036 mol/kg, expressed in units of mol/kg. The unit of mol/kg is a unit representing the number of moles of the substance contained in 1 kg of the surface treatment liquid.

Since the azole silane coupling agent is present at a relatively low concentration in the surface treatment liquid as described above, and may be present in the form of a silane oligomer (for example, a dimer, a trimer, or the like) as described above, it is difficult to strictly measure the concentration of the azole silane coupling agent, but the added concentration (that is, a set concentration) of the azole silane coupling agent is preferably from 0.30 to 1.00% by weight, more preferably from 0.45 to 0.95% by weight, and still more preferably from 0.48 to 0.85% by weight with respect to the total amount of the surface treatment liquid from the viewpoint of further improving the film-forming property. The azole silane coupling agent may be used alone or in combination of two or more. When two or more azole silane coupling agents are used in combination, the total amount thereof may be within the above range.

The added concentration of the azole silane coupling agent is usually from 0.0004 to 0.36 mol/kg, preferably from 0.0036 to 0.18 mol/kg, and more preferably from 0.011 to 0.036 mol/kg, expressed in units of mol/kg.

For the atomic concentration of silicon contained in the surface treatment liquid, a value determined by an ICP emission spectrophotometer (iCAP 6000 series; made by Thermo Fisher Scientific K. K.) is used.

Organic Acid Ion (A) as Second Component

The surface treatment liquid of the present invention contains (A) an organic acid ion having one to three acidic groups in one molecule. The organic acid ion (A) is an ion of an organic acid having one to three acidic groups in one molecule. The acidic group is a group that can exhibit acidity in water, and may be, for example, a carboxyl group, a sulfonic acid group, or a mixture thereof. The acidic group of the organic acid ion (A) is bonded to a carbon atom, and specifically, forms a covalent bond with the carbon atom. The organic acid ion (A) has an action of promoting dissolution of the azole silane coupling agent in the surface treatment liquid, for example, an action of promoting hydrolysis of the azole silane coupling agent.

Specifically, in an organic acid compound having one to three acidic groups (for example, a carboxyl group and/or a sulfonic acid group) in one molecule, the organic acid ion (A) is an ion (that is, an organic acid anion) in which the acidic group is ionized (that is, anionized), and may be a so-called carboxylate anion, sulfonate anion, or mixed anion thereof. For example, among the organic acid ions (A), the ions of the organic acid compound having one to three carboxyl groups in one molecule may be referred to as a monocarboxylic acid ion, a dicarboxylic acid ion, and a tricarboxylic acid ion, respectively. Further, for example, among the organic acid ions (A), the ions of the organic acid compound having one to three sulfonic acid groups in one molecule may be referred to as a monosulfonic acid ion, a disulfonic acid ion, and a trisulfonic acid ion, respectively. From the viewpoint of further improving the film-forming property, the surface treatment liquid of the present invention preferably contains one or more kinds of ions selected from the group consisting of a monocarboxylic acid ion and a monosulfonic acid ion, and more preferably contains a monocarboxylic acid ion, among the organic acid ion (A).

The organic acid ion (A) is added to and used in the surface treatment liquid in the form of a compound (or additive) capable of providing the organic acid ion (A) in the surface treatment liquid (for example, water).

The compound (herein also referred to as an organic acid compound (a)) capable of providing the organic acid ion (A) in the surface treatment liquid (for example, water) includes, for example, a compound (herein also referred to as a monocarboxylic acid compound (a1), a dicarboxylic acid compound (a2), a tricarboxylic acid compound (a3), a monosulfonic acid compound (a4), a disulfonic acid compound (a5), and a trisulfonic acid compound (a6)) capable of providing a monocarboxylic acid ion, a dicarboxylic acid ion, a tricarboxylic acid ion, a monosulfonic acid ion, a disulfonic acid ion, or a trisulfonic acid ion respectively in the surface treatment liquid (for example, water). The organic acid compound (a) is a supply source of the organic acid ion (A). The organic acid compound (a) may further have not only one to three acidic groups but also one or more (particularly one to three) hydroxyl group and/or one or more (particularly one to three) amino group in one molecule.

The monocarboxylic acid compound (a1) is one or more kinds of compounds selected from the group consisting of an aliphatic or aromatic organic compound having one carboxyl group in one molecule, and an acid anhydride and a metal salt compound thereof, and may have a hydroxyl group and/or an amino group. When the monocarboxylic acid compound (a1) is an aliphatic organic compound, and an acid anhydride and a metal salt compound thereof, the monocarboxylic acid compound (a1) may be a saturated or unsaturated aliphatic organic compound, and an acid anhydride and a metal salt compound thereof, and from the viewpoint of improving solubility, the monocarboxylic acid compound (a1) is preferably one or more kinds of compounds selected from the group consisting of a saturated aliphatic organic compound and an acid anhydride and a metal salt compound thereof. Since the monocarboxylic acid compound (a1) is inexpensive, the monocarboxylic acid compound (a1) is one or more kinds of compounds selected from the group consisting of an aliphatic organic compound having one carboxyl group in one molecule, and an acid anhydride and a metal salt compound thereof, and is preferably a compound not having a hydroxyl group or an amino group.

Specific examples of the monocarboxylic acid compound (a1) include the following acids, and acid anhydrides and metal salt compounds thereof:

Formic acid (saturated aliphatic, 1 carbon atom, COOH=1, OH=0, $NH_2$=0);
acetic acid (saturated aliphatic, 2 carbon atoms, COOH=1, OH=0, $NH_2$=0);
propionic acid (saturated aliphatic, 3 carbon atoms, COOH=1, OH=0, $NH_2$=0);
butyric acid (saturated aliphatic, 4 carbon atoms, COOH=1, OH=0, $NH_2$=0);
valeric acid (saturated aliphatic, 5 carbon atoms, COOH=1, OH=0, $NH_2$=0);
2-ethylbutyric acid (saturated aliphatic, 6 carbon atoms, COOH=1, OH=0, $NH_2$=0);
caproic acid (saturated aliphatic, 6 carbon atoms, COOH=1, OH=0, $NH_2$=0);
enanthic acid (saturated aliphatic, 7 carbon atoms, COOH=1, OH=0, $NH_2$=0);
caprylic acid (saturated aliphatic, 8 carbon atoms, COOH=1, OH=0, $NH_2$=0);
pelargonic acid (aliphatic, 9 carbon atoms, COOH=1, OH=0, $NH_2$=0);
capric acid (saturated aliphatic, 10 carbon atoms, COOH=1, OH=0, $NH_2$=0);
lauric acid (saturated aliphatic, 12 carbon atoms, COOH=1, OH=0, $NH_2$=0);
myristic acid (saturated aliphatic, 14 carbon atoms, COOH=1, OH=0, $NH_2$=0);
palmitic acid (saturated aliphatic, 16 carbon atoms, COOH=1, OH=0, $NH_2$=0);
margaric acid (saturated aliphatic, 17 carbon atoms, COOH=1, OH=0, $NH_2$=0);
oleic acid (unsaturated aliphatic, 18 carbon atoms, COOH=1, OH=0, $NH_2$=0);
stearic acid (saturated aliphatic, 18 carbon atoms, COOH=1, OH=0, $NH_2$=0);
levulinic acid (aliphatic, 5 carbon atoms, COOH=1, OH=0, $NH_2$=0);
glycolic acid (saturated aliphatic, 2 carbon atoms, COOH=1, OH=1, $NH_2$=0);
lactic acid (saturated aliphatic, 3 carbon atoms, COOH=1, OH=1, $NH_2$=0);
malic acid (saturated aliphatic, 4 carbon atoms, COOH=1, OH=1, $NH_2$=0);
gluconic acid (saturated aliphatic, 6 carbon atoms, COOH=1, OH=6, $NH_2$=0);
glyceric acid (saturated aliphatic, 3 carbon atoms, COOH=1, OH=2, $NH_2$=0);
glycine (saturated aliphatic, 2 carbon atoms, COOH=1, OH=0, $NH_2$=1); and
benzoic acid (aromatic, 7 carbon atoms, COOH=1, OH=0, $NH_2$=0).

The dicarboxylic acid compound (a2) is one or more kinds of compounds selected from the group consisting of an aliphatic or aromatic organic compounds having two carboxyl groups in one molecule, and an acid anhydride and a metal salt compound thereof, and may have a hydroxyl group and/or an amino group. When the dicarboxylic acid compound (a2) is an aliphatic organic compound, and an acid anhydride and a metal salt compound thereof, the dicarboxylic acid compound (a2) may be one or more kinds of compounds selected from the group consisting of a saturated or unsaturated aliphatic organic compound, and an acid anhydride and a metal salt compound thereof.

Specific examples of the dicarboxylic acid compound (a2) include the following acids and acid anhydrides and metal salt compounds thereof:

Oxalic acid (saturated aliphatic, 2 carbon atoms, COOH=2, OH=0, $NH_2$=0);
malonic acid (saturated aliphatic, 3 carbon atoms, COOH=2, OH=0, $NH_2$=0);
succinic acid (saturated aliphatic, 4 carbon atoms, COOH=2, OH=0, $NH_2$=0);
tartaric acid (saturated aliphatic, 4 carbon atoms, COOH=2, OH=2, $NH_2$=0); and
phthalic acid (aromatic, 8 carbon atoms, COOH=2, OH=0, $NH_2$=0).

The tricarboxylic acid compound (a3) is one or more kinds of compounds selected from the group consisting of an aliphatic or aromatic organic compounds having three carboxyl groups in one molecule, and an acid anhydride and a metal salt compound thereof, and may have a hydroxyl group and/or an amino group. When the tricarboxylic acid compound (a3) is an aliphatic organic compound, and an acid anhydride and a metal salt compound thereof, the tricarboxylic acid compound (a3) may be one or more kinds of compounds selected from the group consisting of a saturated or unsaturated aliphatic organic compound and an acid anhydride and a metal salt compound thereof.

Specific examples of the tricarboxylic acid compound (a3) include the following acids and acid anhydrides and metal salt compounds thereof:

Propane-1,2,3-tricarboxylic acid (saturated aliphatic, 6 carbon atoms, COOH=3, OH=0, $NH_2$=0); and citric acid (saturated aliphatic, 6 carbon atoms, COOH=3, OH=1, $NH_2$=0).

The monosulfonic acid compound (a4) is one or more kinds of compounds selected from the group consisting of an aliphatic or aromatic organic compound having one sulfonic group in one molecule, and an acid anhydride and a metal salt compound thereof, and may have a hydroxyl group and/or an amino group. When the monosulfonic acid compound (a4) is an aliphatic organic compound; and an acid anhydride and a metal salt compound thereof, the monosulfonic acid compound (a4) may be one or more kinds of compounds selected from the group consisting of a saturated or unsaturated aliphatic organic compound and an acid anhydride and a metal salt compound thereof. From the viewpoint of improving solubility, the monosulfonic acid compound (a4) is preferably one or more kinds of compounds selected from the group consisting of an aromatic organic compound, and an acid anhydride and a metal salt compound thereof. Since the monosulfonic acid compound (a4) is inexpensive, the monosulfonic acid compound (a4) is one or more kinds of compounds selected from an aromatic organic compound having one sulfonic group in one molecule, and an acid anhydride and a metal salt compound thereof, and is preferably a compound not having a hydroxyl group or an amino group.

Specific examples of the monosulfonic acid compound (a4) include the following acids and acid anhydrides and metal salt compounds thereof:

Benzenesulfonic acid (aromatic, 6 carbon atoms, $SO_3H$=1, OH=0, $NH_2$=0);

tosylic acid (aromatic, 7 carbon atoms, $SO_3H$=1, OH=0, $NH_2$=0);

methanesulfonic acid (aliphatic, 1 carbon atom, $SO_3H$=1, OH=0, $NH_2$=0);

5-sulfosalicylic acid (aromatic, 7 carbon atoms, $SO_3H$=1, OH=1, $NH_2$=0, COOH=1);

4-hydroxybenzenesulfonic acid (aromatic, 6 carbon atoms, $SO_3H$=1, OH=1, $NH_2$=0);

3-methyl-4 hydroxybenzenesulfonic acid (7 carbon atoms, $SO_3H$=1, OH=1, $NH_2$=0); and 4-aminobenzenesulfonic acid (6 carbon atoms, $SO_3H$=1, OH=0, $NH_2$=1).

The disulfonic acid compound (a5) is one or more kinds of compounds selected from the group consisting of an aliphatic or aromatic organic compound having two sulfonic groups in one molecule, and an acid anhydride and a metal salt compound thereof, and may have a hydroxyl group and/or an amino group. When the disulfonic acid compound (a5) is an aliphatic organic compound, and an acid anhydride and a metal salt compound thereof, the disulfonic acid compound (a5) may be one or more kinds of compounds selected from the group consisting of a saturated or unsaturated aliphatic organic compound and an acid anhydride and a metal salt compound thereof.

Specific examples of the disulfonic acid compound (a5) include the following acids and acid anhydrides and metal salt compounds thereof:

Benzenedisulfonic acid (aromatic, 6 carbon atoms, $SO_3H$=2, OH=0, $NH_2$=0).

The trisulfonic acid compound (a6) is one or more kinds of compounds selected from the group consisting of an aliphatic or aromatic organic compound having three sulfonic groups in one molecule, and an acid anhydride and a metal salt compound thereof, and may have a hydroxyl group and/or an amino group. When the trisulfonic acid compound (a6) is an aliphatic organic compound, and an acid anhydride and a metal salt compound thereof, the trisulfonic acid compound (a6) may be one or more kinds of compounds selected from the group consisting of a saturated or unsaturated aliphatic organic compound and an acid anhydride and a metal salt compound thereof.

Specific examples of the trisulfonic acid compound (a6) include the following acids and acid anhydrides and metal salt compounds thereof:

Benzenetrisulfonic acid (aromatic, 6 carbon atoms, $SO_3H$=3, OH=0, $NH_2$=0).

The metal constituting the metal salt compound as the organic acid compound (a) is not particularly limited, and may be, for example, copper, sodium, potassium, magnesium, calcium, aluminum, titanium, nickel, tin, iron, silver, or gold. From the viewpoint of improving the solubility of the organic acid compound (a), sodium or potassium is preferred. The organic acid compound (a) may be a hydrate.

An alkali metal salt of an organic acid, for example, sodium formate, is also useful as a supply source of an alkali metal ion (C1) to be described later.

A copper salt of an organic acid, for example, copper formate is also useful as a supply source of a copper ion (D) to be described later.

The number of carbon atoms in the organic acid compound (a) is not particularly limited, and is preferably 8 or less, more preferably 6 or less, still more preferably 3 or less, particularly preferably 2 or less, and most preferably 1 from the viewpoint of further improving the film-forming property. The number of carbon atoms of the organic acid compound (a) also includes the number of carbon atoms constituting the carboxyl group.

Since the organic acid compound (a) is inexpensive, it is preferably the monocarboxylic acid compound (a1). Furthermore, from the viewpoint of improving the solubility of the organic acid compound (a), it is preferably one or more kinds of compounds selected from the group consisting of the monocarboxylic acid compound (a1) and the monosulfonic acid compound (a4), more preferably the monocarboxylic acid compound (a1), and still more preferably formic acid.

From the viewpoint of improving the solubility of the organic acid compound (a), the organic acid compound (a) is preferably a compound belonging to aliphatic or aromatic series, and more preferably an acid belonging to aliphatic series.

From the viewpoint of further improving the film-forming property, the organic acid compound (a) preferably has no hydroxyl group and no amino group.

From the viewpoint of further improving the film-forming property, the organic acid ion (A) is preferably one or more kinds of ions selected from a monocarboxylic acid ion and a monosulfonic acid ion, more preferably a monocarboxylic acid ion, and still more preferably a formate ion.

The concentration of the organic acid ion (A) in the surface treatment liquid is usually from 0.010 to 50.0% by weight with respect to the total amount of the surface treatment liquid. The concentration of the organic acid ion (A) in the surface treatment liquid is preferably from 1.00 to 20.0% by weight, and more preferably from 2.50 to 10.0% by weight with respect to the total amount of the surface treatment liquid from the viewpoint of further improving the film-forming property. The concentration of the organic acid ion (A) is preferably from 2.50 to 7.00% by weight, more preferably from 3.50 to 7.00% by weight, still more preferably from 3.50 to 6.00% by weight, particularly preferably from 4.00 to 6.00% by weight, more sufficiently preferably from 4.00 to 5.20% by weight, and most preferably from 4.00 to 5.10% by weight with respect to the total amount of the surface treatment liquid from the viewpoint of further improving the film-forming property and preventing turbidity of the surface treatment liquid. When the surface treatment liquid does not contain the organic acid ion (A), the film-forming property is deteriorated. The organic acid compound (a) may be used alone or in combination of two or more. When the organic acid compound (a) is used alone, the organic acid compound (a) may be used in such an amount that the concentration of the organic acid ion (A) supplied from the organic acid compound (a) falls within the above range. When two or more organic acid compounds (a) are used in combination, the organic acid compounds (a) may be used in such an amount that the total concentration of the organic acid ions (A) supplied from these organic acid compounds (a) falls within the above range.

The concentration of the organic acid ion (A) contained in the surface treatment liquid is usually from 0.0022 to 11.1 mol/kg, preferably from 0.22 to 4.44 mol/kg, and more preferably from 0.56 to 2.22 mol/kg, expressed in units of mol/kg.

For the concentration of the organic acid ion (A), a value measured by ion chromatography (IC-2001; made by Tosoh Corporation) is used. The concentration measured by such ion chromatography is the concentration of the organic acid ion (A) at which the organic acid compound (a) is completely dissociated.

Inorganic Acid Ion (B) as Third Component

The surface treatment liquid of the present invention contains (B) an inorganic acid ion (herein also referred to as inorganic acid ion (B)). By increasing the total number of ions in the liquid together with the alkali ion (C), the inorganic acid ion (B) has an action of promoting the generation of the chemical film by the azole silane coupling agent due to the salting-out effect during the surface treatment.

Examples of the inorganic acid ion (B) include a sulfate ion ($SO_4^{2-}$), a nitrate ion ($NO_3^-$), a phosphate ion ($PO_4^{3-}$), and a chloride ion ($Cl^-$). A sulfate ion is preferred from the viewpoint of further improving the film-forming property based on the salting-out effect and reducing environmental load. The inorganic acid ion (A) is not bonded to a carbon atom, and specifically, is free alone in the surface treatment liquid (or water).

The inorganic acid ion (B) is added to and used in the surface treatment liquid in the form of a compound (or additive) (herein also referred to as inorganic acid compound (b)) capable of providing the inorganic acid ion (B) in the surface treatment liquid (for example, water). The inorganic acid compound (b) is a supply source of the inorganic acid ion (B).

The inorganic acid compound (b) is an inorganic acid, and a metal salt compound and an ammonium salt compound thereof, and is, for example, an inorganic acid such as sulfuric acid, nitric acid, phosphoric acid, and hydrochloric acid; a metal salt compound of the inorganic acid by a metal such as copper, sodium, potassium, magnesium, calcium, aluminum, titanium, nickel, tin, iron, silver or gold (including hydrates thereof); and an ammonium salt compound of the inorganic acid. From the viewpoint of the solubility of the inorganic acid compound (b), the metal salt compound of the inorganic acid is preferably one or more kinds of compounds selected from the group consisting of a sodium salt, a potassium salt, and an ammonium salt, more preferably one or more kinds of compounds selected from the group consisting of a sodium salt and a potassium salt, and still more preferably a sodium salt.

An alkali metal salt of the inorganic acid (for example, sodium sulfate, potassium sulfate, sodium nitrate, potassium nitrate, sodium phosphate, potassium phosphate, sodium chloride, and potassium chloride) is also useful as a supply source of an alkali metal ion (C1) to be described later.

The ammonium salt of the inorganic acid is also useful as a supply source of an ammonium ion (C2) to be described later.

A copper salt of the inorganic acid (for example, copper sulfate, copper nitrate, copper phosphate, and copper chloride) is also useful as a supply source of a copper ion (D) to be described later.

The inorganic acid compound (b) is preferably an inorganic acid compound having a bulkier inorganic acid ion (B) supplied from the inorganic acid compound (b) from the viewpoint of further improving the film-forming property based on the salting-out effect. Preferred examples of the inorganic acid compound (b) from such a viewpoint include sulfuric acid, nitric acid, phosphoric acid, and metal salt compounds and ammonium salt compounds thereof. More preferred examples of the inorganic acid compound (b) from the same viewpoint include sulfuric acid, phosphoric acid, and metal salt compounds and ammonium salt compounds thereof. From the viewpoint of environmental load, sulfuric acid and metal salt compounds and ammonium salt compounds thereof are more preferable, sodium sulfate, potassium sulfate, copper sulfate (and a hydrate thereof (particularly pentahydrate)), and ammonium sulfate are still more preferable, and sodium sulfate and copper sulfate (and a hydrate thereof (particularly pentahydrate)) are particularly preferable.

The inorganic acid of the inorganic acid compound (b) is preferably sulfuric acid, nitric acid, or hydrochloric acid from the viewpoint of acid dissociation constant (pKa1). Furthermore, sulfuric acid is more preferable from the viewpoint of environmental load.

The concentration of the inorganic acid ion (B) in the surface treatment liquid is usually from 0.10 to 10.0% by weight with respect to the total amount of the surface treatment liquid, and is preferably from 0.30 to 3.00% by weight, more preferably from 0.50 to 3.00% by weight, still more preferably from 0.90 to 3.00% by weight, particularly preferably from 1.20 to 3.00% by weight, more sufficiently preferably from 1.50 to 2.50% by weight, and most preferably from 1.80 to 2.50% by weight with respect to the total amount of the surface treatment liquid from the viewpoint of further improving the film-forming property and preventing turbidity of the surface treatment liquid. When the surface treatment liquid does not contain the inorganic acid ion (B), the film-forming property is deteriorated. The inorganic acid compound (b) may be used alone or in combination of two or more. When the inorganic acid compound (b) is used alone, the inorganic acid compound (b) may be used in such an amount that the concentration of the inorganic acid ion (B) supplied from the inorganic acid compound (b) falls within the above range. When two or more inorganic acid compounds (b) are used in combination, the inorganic acid compounds (b) may be used in such an amount that the total concentration of the inorganic acid ions (B) supplied from these inorganic acid compounds (b) falls within the above range.

The concentration of the inorganic acid ion (B) contained in the surface treatment liquid is usually from 0.010 to 1.04 mol/kg, preferably from 0.031 to 0.31 mol/kg, and more preferably from 0.052 to 0.31 mol/kg, expressed in units of mol/kg.

For the concentration of the inorganic acid ion (B), a value measured by ion chromatography (IC-2001; made by Tosoh Corporation) is used. The concentration measured by such ion chromatography is the concentration of the inorganic acid ion (B) at which the inorganic acid compound (b) is completely dissociated.

Alkali Ion (C) as Fourth Component

The surface treatment liquid of the present invention contains (C) an alkali ion (herein also referred to as alkali ion (C)). The alkali ion (C) is used as a concept of including both an alkali metal ion (C1) and an ammonium ion (C2), and may be the alkali metal ion (C1) and/or the ammonium ion (C2). Specifically, the alkali ion (C) may be one or both of the alkali metal ion (C1) and the ammonium ion (C2). By increasing the total number of ions in the liquid together with the inorganic ion (B), the alkali ion (C) has an action of promoting the generation of the chemical film by the azole silane coupling agent due to the salting-out effect during the surface treatment.

Examples of the alkali metal ion (C1) include a lithium ion, a sodium ion, and a potassium ion.

The ammonium ion (C2) is $NH^{4+}$.

Since the alkali ion (C) is inexpensive (that is, from the viewpoint of economic efficiency), a sodium ion, a potassium ion, and an ammonium ion are preferable, and from the viewpoint of further improving the film-forming property, improving economic efficiency, and preventing turbidity of the surface treatment liquid, a sodium ion and an ammonium ion are more preferable, and a sodium ion is still more preferable.

The alkali metal ion (C1) is added to and used in the surface treatment liquid in the form of a compound (or additive) (herein also referred to as alkali metal compound (c1)) capable of providing the alkali metal ion (C1) in the surface treatment liquid (for example, water). The alkali metal compound (c1) is a supply source of the alkali metal ion (C1).

Examples of the alkali metal compound (c1) include water-soluble compounds such as sodium sulfate, sodium hydroxide, sodium nitrate, potassium hydroxide, potassium sulfate, lithium hydroxide, sodium carbonate, sodium hydrogen carbonate, potassium carbonate, potassium hydrogen carbonate, sodium chloride, potassium chloride, sodium acetate, potassium acetate, lithium acetate, sodium bromide, potassium bromide, sodium nitrate, potassium nitrate, sodium phosphate, disodium monohydrogen phosphate, and sodium dihydrogen phosphate.

The ammonium ion (C2) is added to and used in the surface treatment liquid in the form of a compound (or additive) (herein also referred to as ammonium compound (c2)) capable of providing the ammonium ion (C2) in the surface treatment liquid (for example, water). The ammonium compound (c2) is a supply source of the ammonium ion (C2).

Examples of the ammonium compound (c2) include water-soluble compounds such as ammonia, ammonium sulfate, ammonium formate, ammonium acetate, ammonium chloride, ammonium carbonate, and ammonium nitrate.

The alkali metal compound (c1) and the ammonium compound (c2) are preferably sodium sulfate, sodium hydroxide, potassium hydroxide, potassium sulfate, sodium chloride, sodium nitrate, ammonia, and ammonium sulfate, and more preferably sodium sulfate and sodium hydroxide, from the viewpoint of further improving the film-forming property, improving economic efficiency, and preventing turbidity of the surface treatment liquid.

The alkali metal salt and ammonium salt of the organic acid (for example, sodium formate) are also useful as supply sources of the aforementioned organic acid ion (A).

The alkali metal salt and ammonium salt of the inorganic acid (for example, sodium sulfate and ammonium sulfate) are also useful as supply sources of the aforementioned inorganic acid ion (B).

The concentration of the alkali ion (C) in the surface treatment liquid is not particularly limited, and is usually from 1.00 to 20.0% by weight, and is preferably from 1.00 to 15.0% by weight, more preferably from 1.00 to 8.00% by weight, and still more preferably from 1.50 to 6.00% by weight with respect to the total amount of the surface treatment liquid from the viewpoint of further improving the film-forming property. The concentration of the alkali ion (C) is the total concentration of the alkali metal ion (C1) and the ammonium ion (C2). The concentration of the alkali ion (C) is preferably from 1.50 to 4.50% by weight, more preferably from 2.10 to 4.00% by weight, still more preferably from 2.40 to 3.70% by weight, and particularly preferably from 2.50 to 3.00% by weight with respect to the total amount of the surface treatment liquid from the viewpoint of further improving the film-forming property and preventing turbidity of the surface treatment liquid. When the surface treatment liquid does not contain the alkali ion (C), the film-forming property is deteriorated. In the present invention, at least one of the alkali metal compound (c1) or the ammonium compound (c2) is used. The alkali metal compound (c1) and the ammonium compound (c2) may be each independently used alone, or in combination of two or more. When only one of the alkali metal compound (c1) and the ammonium compound (c2) is used, the compound may be used in such an amount that the concentration of the alkali ion (C) supplied from the compound falls within the above range. When two or more compounds of the alkali metal compound (c1) and the ammonium compound (c2) are used in combination, they may be used in such an amount that the total concentration of the alkali ions (C) supplied from these compounds falls within the above range.

The concentration of the alkali ion (C) contained in the surface treatment liquid is usually from 0.43 to 8.70 mol/kg, preferably from 0.43 to 6.52 mol/kg, and more preferably from 0.43 to 3.48 mol/kg, expressed in units of mol/kg.

For the concentration of the alkali metal ion (C1), a value determined by an ICP emission spectrophotometer (iCAP 6000 series; made by Thermo Fisher Scientific K. K.) is used.

For the concentration of the ammonium ion (C2), a value measured by ion chromatography (IC-2001; made by Tosoh Corporation) is used. The concentration measured by such ion chromatography is the concentration of the ammonium ion (C2) at which the ammonium compound (c2) is completely dissociated.

Copper Ion (D) as Fifth Component

The surface treatment liquid of the present invention contains (D) a copper ion (herein also referred to as copper ion (D)). The copper ion (D) plays an auxiliary role in formation of a chemical film by the azole silane coupling agent.

The copper ion (D) is added to and used in the surface treatment liquid in the form of a compound (or additive) (herein also referred to as copper compound (d)) capable of providing the copper ion (D) in the surface treatment liquid (for example, water). The copper compound (d) is a supply source of the copper ion (D).

Examples of the copper compound (d) include copper sulfate (and a hydrate thereof (particularly pentahydrate)), copper formate (and a hydrate thereof (particularly tetrahydrate)), copper nitrate, copper chloride, copper acetate, copper hydroxide, copper oxide, copper sulfide, copper carbonate, copper bromide, copper phosphate, and copper benzoate. From the viewpoint of the solubility of the copper compound (d), copper sulfate, copper formate, copper nitrate, and copper acetate are preferable.

The copper salt of the organic acid (for example, copper formate and copper acetate) is also useful as a supply source of the aforementioned organic acid ion (A).

The copper salt of the inorganic acid (for example, copper sulfate and copper nitrate) is also useful as a supply source of the aforementioned inorganic acid ion (B).

The concentration of the copper ion (D) in the surface treatment liquid is usually from 0.0001 to 1.00% by weight with respect to the total amount of the surface treatment liquid. The concentration of the copper ion (D) in the surface treatment liquid is preferably from 0.001 to 0.200% by weight, and more preferably from 0.008 to 0.100% by weight with respect to the total amount of the surface treatment liquid from the viewpoint of further improving the film-forming property. The concentration of the copper ion (D) is preferably from 0.012 to 0.060% by weight, and more preferably from 0.012 to 0.040% by weight with respect to the total amount of the surface treatment liquid from the viewpoint of further improving the film-forming property and preventing turbidity of the surface treatment liquid. When the surface treatment liquid does not contain the copper ion (D), the film-forming property is deteriorated. The copper compound (d) may be used alone or in combination of two or more. When the copper compound (d) is used alone, the copper compound (d) may be used in such an amount that the concentration of the copper ion (D) supplied from the copper compound (d) falls within the above range. When two or more copper compounds (d) are used in combination, the copper compounds (d) may be used in such an amount that the total concentration of the copper ions (D) supplied from these copper compounds (d) falls within the above range.

The concentration of the copper ion (D) contained in the surface treatment liquid is usually from 0.00002 to 0.16 mol/kg, preferably from 0.0002 to 0.031 mol/kg, and more preferably from 0.0013 to 0.016 mol/kg, expressed in units of mol/kg.

For the concentration of the copper ion (D), a value determined by an ICP emission spectrophotometer (iCAP 6000 series; made by Thermo Fisher Scientific K. K.) is used.

Other Components

The surface treatment liquid of the present invention may further contain other components that are not classified into the above-described azole silane coupling agent, organic acid compound (a), inorganic acid compound (b), alkali metal compound (c1), ammonium compound (c2), and copper compound (d), for example, other alkali components, organic solvents, and other silane coupling agents.

Examples of other alkali components include amines such as methylamine, dimethylamine, trimethylamine, ethylamine, diethylamine, triethylamine, propylamine, isopropylamine, butylamine, pentylamine, hexylamine, heptylamine, octylamine, nonylamine, allylamine, ethylenediamine, diethylenetriamine, triethylenetetramine, monoethanolamine, diethanolamine, triethanolamine, monopropanolamine, dipropanolamine, tripropanolamine, monoisopropanolamine, diisopropanolamine, triisopropanolamine, 1-amino-2-propanol, 3-amino-1-propanol, 2-amino-1-propanol, N,N-dimethylethanolamine, cyclohexylamine, aniline, pyrrolidine, piperidine, piperazine, and pyridine. These alkali components may be used alone or in combination of two or more.

Examples of the organic solvent include methanol, ethanol, 1-propanol, 2-propanol, butanol, tert-butyl alcohol, 1-methoxy-2-propanol, 1-ethoxy-2-propanol, 1-butoxy-2 propanol, ethylene glycol, propylene glycol, glycerin, diethylene glycol, triethylene glycol, ethylene glycol monomethyl ether, ethylene glycol dimethyl ether, ethylene glycol monoethyl ether, ethylene glycol diethyl ether, ethylene glycol monobutyl ether, propylene glycol monomethyl ether, propylene glycol monoethyl ether, propylene glycol monobutyl ether, diethylene glycol monomethyl ether, diethylene glycol dimethyl ether, diethylene glycol monoethyl ether, diethylene glycol diethyl ether, diethylene glycol monobutyl ether, triethylene glycol dimethyl ether, triethylene glycol diethyl ether, tetrahydrofurfuryl alcohol, furfuryl alcohol, acetone, tetrahydrofuran, dioxane, acetonitrile, 2-pyrrolidone, formamide, dimethylformamide, dimethylacetamide, dimethylsulfoxide, sulfolane, dimethyl carbonate, ethylene carbonate, N-methylpyrrolidone, γ-butyrolactone, and 1,3-dimethyl-2-imidazolidinone. These organic solvents may be used alone or in combination of two or more.

The total content (total concentration) of the other alkali component and the organic solvent is preferably from 0.1 to 50% by weight with respect to the total amount of the surface treatment liquid.

Examples of other silane coupling agent include the following compounds:

Mercaptosilane compounds such as 3-mercaptopropyltrimethoxysilane and 3-mercaptopropylmethyldimethoxysilane;

vinylsilane compounds such as vinyltrichlorosilane, vinyltrimethoxysilane, and vinyltriethoxysilane;

styrylsilane compounds such as p-styryltrimethoxysilane;

epoxysilane compounds such as 2-(3,4-epoxycyclohexyl) ethyltrimethoxysilane, 3-glycidoxypropyltrimethoxysilane, 3-glycidoxypropylmethyldiethoxysilane, and 3-glycidoxypropyltriethoxysilane;

acryloxysilane compounds such as 3-acryloxypropyltrimethoxysilane;

methacryloxysilane compounds such as methacryloxypropylmethyldimethoxysilane, methacryloxypropyltrimethoxysilane, methacryloxypropylmethyldiethoxysilane, and methacryloxypropyltriethoxysilane;

aminosilane compounds such as N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, and N-(vinylbenzyl)-2-aminoethyl-3-aminopropyltrimethoxysilane;

ureidosilane compounds such as 3-ureidopropyltriethoxysilane;

chloropropylsilane compounds such as 3-chloropropyltrimethoxysilane;

sulfidesilane compounds such as bis(triethoxysilylpropyl) tetrasulfide; and isocyanatosilane compounds such as 3-isocyanatopropyltriethoxysilane. In addition, aluminum coupling agents, titanium coupling agents, zirconium coupling agents, and the like can also be exemplified.

The other silane coupling agents may be used alone or in combination of two or more.

pH of Surface Treatment Liquid

The surface treatment liquid of the present invention can be usually prepared at a pH of 1.0 to 12.0. From the viewpoint of further improving the film-forming property, the surface treatment liquid of the present invention preferably has a pH of 2.0 to 6.5, more preferably has a pH of 2.5 to 6.5, still more preferably has a pH of 3.8 to 6.0, and particularly preferably has a pH of 3.8 to 5.8.

The pH of the surface treatment liquid of the present invention is preferably from 3.8 to 5.2, more preferably from 4.4 to 5.2, still more preferably from 4.5 to 5.0, and particularly preferably from 4.6 to 5.0 from the viewpoint of further improving the film-forming property and preventing turbidity of the surface treatment liquid.

The pH of the surface treatment liquid of the present invention can be controlled by adjusting the kinds and contents of the organic acid compound (a), the inorganic acid compound (b), the alkali metal compound (c1), and the ammonium compound (c2).

[Method for Producing Surface Treatment Liquid for Metal]

The present invention also provides a method for producing the above-described surface treatment liquid.

The method for producing the surface treatment liquid according to the present invention is characterized by combining an azole silane coupling agent, an organic acid compound (a), an inorganic acid compound (b), an alkali metal compound (c1) and/or an ammonium compound (c2), a copper compound (d) (and optionally other components), and water. "Combining" means that all the components may be mixed in any combination as long as the obtained surface treatment liquid finally contains all the components at a predetermined concentration. For example, all the components may be mixed at once (batch mixing method), or some of all the components may be mixed in advance, and then the remaining components may be further mixed (divided mixing method).

In particular, in the divided mixing method, for example, the following embodiments are mentioned: In the following, the azole silane coupling agent is represented by "x", the organic acid compound (a) is represented by "a", the inorganic acid compound (b) is represented by "b", the alkali metal compound (c1) and the ammonium compound (c2) are represented by "c", the copper compound (d) is represented by "d", another component is represented by "e", and water is represented by "w".

Embodiment 1

A premixing step p1 of mixing a and w;
a premixing step p2 of mixing c and w;
a premixing step p3 of mixing the mixture obtained in the premixing step p1, the mixture obtained in the premixing step p2, x, b, d (and optionally e) and w; and
a final mixing step of mixing the mixture obtained in the premixing step p3 and w.

Embodiment 2

A pre-mixing step p1 of mixing a and w;
a premixing step p2 of mixing the mixture obtained in the premixing step p1, x, b, d (and optionally e) and w;
a premixing step p3 of mixing c (and optionally e) and w; and
a final mixing step of mixing the mixture obtained in the premixing step p2 and the mixture obtained in the premixing step p3.

Embodiment 3

A premixing step p1 of mixing a and w;
a premixing step p2 of mixing c and w;
a premixing step p3 of mixing the mixture obtained in the premixing step p1, the mixture obtained in the premixing step p2, x, d (and optionally e) and w; and
a final mixing step of mixing the mixture obtained in the premixing step p3 and b.

In the method for producing the surface treatment liquid according to the present invention, when one component to be mixed is also useful as another component, the mixing operation (or mixing step) of the other component can be omitted as long as the mixing operation (or mixing step) of the one component is performed.

Specifically, sodium sulfate is useful as both the inorganic acid compound (b) and the alkali metal compound (c1). Therefore, for example, when sodium sulfate is mixed as the inorganic acid compound (b), the mixing operation (or mixing step) of the alkali metal compound (c1) can be omitted. Further, for example, when sodium sulfate is mixed as the alkali metal compound (c1), the mixing operation (or mixing step) of the inorganic acid compound (b) can be omitted.

More specifically, for example, in Embodiment 3 above, when sodium sulfate is mixed as "b" in the final mixing step, the premixing step p2 of mixing "c" can be omitted. Further, for example, in Embodiment 3 above, when sodium sulfate is mixed as "c" in the premixing step p2, the final mixing step of mixing "b" can be omitted.

The surface treatment liquid of the present invention can be easily produced in a relatively short stirring time even at room temperature of 10 to 30° C. The stirring time is usually from 10 minutes to 30 minutes. Examples of the water used for producing the surface treatment liquid include pure water such as ion-exchanged water, distilled water, and purified water.

[Liquid Concentrate of Surface Treatment Liquid for Metal (Surface Treatment Stock Solution for Metal)]

The liquid concentrate of the surface treatment liquid according to the present invention is a liquid (for example, an aqueous solution) (that is, a liquid before dilution) to be used by being diluted with water (for example, water alone), and specifically, is a liquid (that is, a liquid before dilution) from which the above-described surface treatment liquid is obtained by dilution with water (for example, water alone). In the present invention, the liquid concentrate of the surface treatment liquid is also referred to as a "surface treatment stock solution".

In one embodiment, the liquid concentrate of the surface treatment liquid for metal according to the present invention is a liquid concentrate (for example, a concentrated aqueous solution) of the surface treatment liquid for metal containing an azole silane coupling agent, and further contains an organic acid ion (A) (for example, a formate ion), an inorganic acid ion (B) (for example, a sulfate ion), an alkali ion (C) (for example, a sodium ion and/or an ammonium ion), and a copper ion (D), and the atomic concentration of silicon contained in the liquid concentrate is in the range of 0.10 to 1.00% by weight.

The liquid concentrate of the surface treatment liquid for metal according to the present invention is a liquid concentrate for producing the surface treatment liquid for metal by being diluted with water (for example, water alone). The concentration of each of the above-described components in the liquid concentrate of the surface treatment liquid for metal according to the present invention is not particularly limited as long as the surface treatment liquid obtained by dilution finally contains all the components, and is preferably such a concentration that the surface treatment liquid can finally contain all the components at a predetermined concentration. Therefore, the concentration of each of the components in the liquid concentrate of the surface treatment liquid according to the present invention is set to a relatively high concentration according to an assumed dilution ratio. The dilution ratio is, for example, from 1.1 to 10 times, preferably from 1.1 to 8 times, and more preferably from 1.1 to 5 times. The dilution ratio is represented by a value obtained by dividing the volume of the surface treatment liquid obtained after dilution by the volume of the liquid concentrate before dilution.

The liquid concentrate of the surface treatment liquid according to the present invention has a pH that is not particularly limited, and preferably has such a pH that the surface treatment liquid obtained by dilution with water (for example, water alone) finally has the above-described pH.

The liquid concentrate of the surface treatment liquid according to the present invention usually satisfies at least one of the following requirements:

Requirement (1): The liquid concentrate of the surface treatment liquid according to the present invention is a liquid (that is, the liquid before dilution) in which the atomic concentration of silicon falls within the atomic concentration range of silicon in the above-mentioned surface treatment liquid by being diluted with water.

Requirement (2): The liquid concentrate of the surface treatment liquid according to the present invention is a liquid (that is, the liquid before dilution) in which the concentration of the organic acid ion (A) falls within the concentration range of the organic acid ion (A) in the above-mentioned surface treatment liquid by being diluted with water.

Requirement (3): The liquid concentrate of the surface treatment liquid according to the present invention is a liquid (that is, the liquid before dilution) in which the concentration of the inorganic acid ion (B) falls within the concentration range of the inorganic acid ion (B) in the above-mentioned surface treatment liquid by being diluted with water.

Requirement (4): The liquid concentrate of the surface treatment liquid according to the present invention is a liquid (that is, the liquid before dilution) in which the concentration of the alkali ion (C) falls within the concentration range of the alkali ion (C) in the above-mentioned surface treatment liquid by being diluted with water.

Requirement (5): The liquid concentrate of the surface treatment liquid according to the present invention is a liquid (that is, the liquid before dilution) in which the concentration of the copper ion (D) falls within the concentration range of the copper ion (D) in the above-mentioned surface treatment liquid by being diluted with water.

Requirement (6): The liquid concentrate of the surface treatment liquid according to the present invention is a liquid (that is, the liquid before dilution) whose pH falls within the pH range of the above-mentioned surface treatment liquid by being diluted with water.

When the liquid concentrate of the surface treatment liquid according to the present invention satisfies two or more of the requirements (1) to (6), the dilution ratio with water defined in each of the two or more requirements is preferably a common constant ratio.

The liquid concentrate of the surface treatment liquid according to the present invention preferably satisfies at least the requirement (1) among the above-described requirements, more preferably satisfies not only the requirement (1) but also one or more requirement selected from the requirements (2) to (6), and still more preferably satisfies all the requirements.

The water used for dilution is preferably pure water such as ion-exchanged water, distilled water, and purified water. The water used for dilution may be water alone or water (for example, an aqueous solution) containing one or more compounds selected from the group consisting of an azole silane coupling agent, an organic acid compound (a) (for example, a compound capable of providing a formate ion), an inorganic acid compound (b) (for example, a compound capable of providing a sulfate ion), an alkali metal compound (c1) (for example, a compound capable of providing a sodium ion), an ammonium compound (c2) (for example, a compound capable of providing an ammonium ion) and a copper compound (d) (a compound capable of providing a copper ion) (and optionally other components). When the water used for dilution contains one or more compounds selected from the group consisting of an azole silane coupling agent, an organic acid compound (a), an inorganic acid compound (b), an alkali metal compound (c1), an ammonium compound (c2), and a copper compound (d) (and optionally other components), the concentration of the compound in the water used for dilution is not particularly limited as long as the resulting surface treatment liquid finally contains all the components, and the concentration is preferably such a concentration that the surface treatment liquid can finally contain all the components at a predetermined concentration.

[Surface Treatment Liquid Set for Metal]

The present invention also provides a surface treatment liquid set for metal.

The surface treatment liquid set for metal according to the present invention includes a first liquid and a second liquid. The first liquid and the second liquid are combined and distributed on the market, for example, while being stored in separate containers. The "first liquid and the second liquid are combined and distributed on the market" includes not only a case where the first liquid and the second liquid are integrally handled in the market, such as a case where the first liquid and the second liquid are sold as a set, but also a case where the first liquid and the second liquid are distributed separately but are suggested to be used in combination with each other by an instruction manual or the like. The first liquid and the second liquid are mixed with each other to produce the above-described surface treatment liquid for metal. The surface treatment liquid for metal is a surface treatment liquid for metal containing an azole silane coupling agent, an organic acid ion (A) (for example, a formate ion), an inorganic acid ion (B) (for example, a sulfate ion), an alkali ion (C) (for example, a sodium ion and/or an ammonium ion), and a copper ion (D).

In one embodiment of the surface treatment liquid set for metal according to the present invention, the azole silane coupling agent is contained in the first liquid, and for example, the atomic concentration of silicon contained in the first liquid is in the range of 0.033 to 1.00% by weight. The organic acid ion (A) (for example, formate ion), the inorganic acid ion (B) (for example, sulfate ion), the alkali ion (C) (for example, sodium ion and/or ammonium ion), and the copper ion (D) are each independently contained in the first liquid and/or the second liquid. Specifically, the organic acid ion (A) (for example, formate ion), the inorganic acid ion (B) (for example, sulfate ion), the alkali ion (C) (for example, sodium ion and/or ammonium ion), and the copper ion (D) may be each independently contained in one or both of the first liquid and the second liquid.

The first liquid and the second liquid are usually aqueous solutions. The concentration of each of the above-described components in the first liquid and the second liquid is not particularly limited as long as the surface treatment liquid obtained by mutually mixing finally contains all the components, and is preferably such a concentration that the surface treatment liquid can finally contain all the components at a predetermined concentration.

In another embodiment, the second liquid in the above-described embodiment may have a form (that is, a form not containing water) of a substance (a dry matter (that is, a solid) or a liquid) alone as a supply source of each component to be contained in the second liquid. Such another embodiment may be similar to the above-described embodiment except that the second liquid does not contain water, and accordingly, the first liquid further contains water that is no longer contained in the second liquid, or the surface treatment liquid set further contains water that is no longer contained in the second liquid as the third liquid.

[Surface Treatment Method Using Surface Treatment Liquid]

The method of surface-treating a metal using the surface treatment liquid of the present invention is not particularly limited as long as the surface treatment liquid and the surface of the metal can be brought into contact with each other. As a method of bringing the surface treatment liquid into contact with the surface of the metal, for example, a spraying method, an immersion method, a coating method, or the like can be adopted.

The time (treatment time) for bringing the surface treatment liquid of the present invention into contact with the surface of the metal may be appropriately determined according to a desired film thickness. Since the surface treatment liquid of the present invention has a sufficiently high film-forming speed, a thicker chemical film can be formed within a predetermined time.

The film-forming speed largely depends on factors such as the kind and content (for example, the concentration of silicon atoms) of the azole silane coupling agent in the surface treatment liquid, the temperature of the surface treatment liquid, and the treatment time, and thus cannot be generally defined, but for example, when the same kind of azole silane coupling agent is used, the film thickness of the chemical film increases as the concentration of the azole silane coupling agent increases.

For example, even when an azole silane coupling agent AS-1 to be described later is used and the silicon atom concentration in the surface treatment liquid (30° C.) is as low as 0.037 to 0.046% by weight, a chemical film having a film thickness of 98 nm or more (particularly 100 nm or more) by AS-1 can be formed by immersion treatment for 60 seconds.

Further, for example, even when an azole silane coupling agent AS-1 to be described later is used and the silicon atom concentration in the surface treatment liquid (30° C.) is as low as 0.056 to 0.074% by weight, a chemical film having a film thickness of 118 nm or more by AS-1 can be formed by immersion treatment for 60 seconds.

Further, for example, even when an azole silane coupling agent AS-2 to be described later is used and the silicon atom concentration in the surface treatment liquid (30° C.) is as low as 0.046% by weight, a chemical film having a film thickness of 241 nm or more by AS-2 can be formed by immersion treatment for 60 seconds.

Further, for example, even when an azole silane coupling agent AS-3 to be described later is used and the silicon atom concentration in the surface treatment liquid (30° C.) is as low as 0.046% by weight, a chemical film having a film thickness of 185 nm or more by AS-3 can be formed by immersion treatment for 60 seconds.

Further, for example, even when an azole silane coupling agent AS-4 to be described later is used and the silicon atom concentration in the surface treatment liquid (30° C.) is as low as 0.047% by weight, a chemical film having a film thickness of 212 nm or more by AS-4 can be formed by immersion treatment for 60 seconds.

Further, for example, even when an azole silane coupling agent AS-5 to be described later is used and the silicon atom concentration in the surface treatment liquid (30° C.) is as low as 0.046% by weight, a chemical film having a film thickness of 32 nm or more by AS-5 can be formed by immersion treatment for 60 seconds.

Further, for example, even when an azole silane coupling agent AS-6 to be described later is used and the silicon atom concentration in the surface treatment liquid (30° C.) is as low as 0.046% by weight, a chemical film having a film thickness of 58 nm or more by AS-6 can be formed by immersion treatment for 60 seconds.

Further, for example, even when an azole silane coupling agent AS-7 described later is used and the silicon atom concentration in the surface treatment liquid (30° C.) is as low as 0.047% by weight, a chemical film having a film thickness of 286 nm or more can be formed by the AS-7 by immersion treatment for 60 seconds.

Further, for example, even when an azole silane coupling agent AS-8 described later is used and the silicon atom concentration in the surface treatment liquid (30° C.) is as low as 0.046% by weight, a chemical film having a film thickness of 98 nm or more can be formed by the AS-8 by immersion treatment for 60 seconds.

The time (treatment time) for bringing the surface treatment liquid of the present invention into contact with the surface of the metal is not particularly limited, and is preferably from 1 second to 10 minutes, and more preferably from 5 seconds to 3 minutes. When the treatment time is 1 second or more, the chemical film can be sufficiently formed on the metal surface. As a result, when a resin layer (for example, an insulating resin layer) is formed on the surface of the chemical film, a sufficiently high adhesive force between the metal and the resin layer can be obtained. Even when the treatment time is longer than 10 minutes, there is no large difference in the film thickness of the chemical film, thus failing to expect an increase in adhesive force. Therefore, the treatment is preferably performed for 10 minutes or less from the viewpoint of productivity.

The temperature of the surface treatment liquid when the surface treatment liquid is brought into contact with the surface of the metal is not particularly limited, and is preferably from 5 to 50° C. However, the temperature may be appropriately set in a relationship between the treatment time and the desired film thickness.

After the surface treatment liquid is brought into contact with the surface of the metal, the surface of the metal is washed with water as necessary, and is preferably thereafter dried. Drying is preferably performed at a temperature of room temperature (for example, 20° C.) to 150° C., preferably at a temperature of 60 to 120° C., for an approximate time of 1 second to 10 minutes, preferably from 10 seconds to 3 minutes. Incidentally, the water used for washing with water is preferably pure water such as ion-exchanged water, distilled water, and purified water. The method and time of washing with water are not particularly limited, and washing with water may be performed by a method such as a spraying method or an immersion method for an appropriate time.

In the present invention, the dried chemical film may be subjected to a treatment such as plasma, laser, ion beam, ozone, heating, or humidification to modify the surface of the chemical film. Alternatively, washing for the purpose of removing resin/ion residues from the metal surface may be performed using a processing method such as plasma, laser, ion beam, mechanical polishing with pumice and brush, or drilling.

Before the surface treatment liquid is brought into contact with the surface of a metal, an aqueous solution containing a copper ion may be brought into contact with the surface of the metal. The aqueous solution containing a copper ion has a function of making the thickness of a conversion coating formed on the surface of copper uniform. The copper ion source in the aqueous solution containing a copper ion is not particularly limited as long as it is a copper salt dissolved in water, and examples thereof include copper salts such as copper sulfate, copper nitrate, copper chloride, copper formate, and copper acetate. In order to solubilize the copper salt in water, ammonia, hydrochloric acid, or the like may be added.

Before and/or after the surface treatment liquid is brought into contact with the surface of a metal, an aqueous acidic or alkaline solution may be brought into contact with the surface of the metal. This aqueous acidic solution or aqueous alkaline solution also has a function of making the thickness of a conversion coating formed on the surface of copper uniform, similarly to the aqueous solution containing a copper ion. The aqueous acidic solution and the aqueous alkaline solution are not particularly limited. Examples of the aqueous acidic solution include an aqueous solution containing an inorganic acid such as sulfuric acid, nitric acid, or hydrochloric acid, and an aqueous solution containing an organic acid such as formic acid, acetic acid, lactic acid, glycolic acid, or amino acid. Examples of the aqueous alkaline solution include an aqueous solution containing an alkali metal hydroxide such as sodium hydroxide or potassium hydroxide, or an amine such as ammonia, ethanolamine, monopropanolamine, or tetramethylammonium hydroxide.

By the treatment as described above, a chemical film derived from an azole silane coupling agent can be formed on the surface of the metal, and it is thus possible to sufficiently enhance the adhesiveness between a resin layer formed on the chemical film and the metal. In addition, oxidation of the metal can be suppressed owing to protection by the chemical film. Therefore, in a printed wiring board including a metal wiring layer and an insulating resin layer, or the like, adhesiveness between the metal wiring layer (metal circuit) and the insulating resin layer (resin material) can be enhanced without particularly performing a roughening treatment, and formation of an oxide of the metal can be reduced.

Examples of the metal to be treated with the surface treatment liquid of the present invention include copper, aluminum, titanium, nickel, tin, iron, silver, gold, and alloys thereof. As to specific examples of the alloy, a copper alloy is not particularly limited as long as it is an alloy containing copper, and examples thereof include alloys of Cu—Ag based, Cu—Te based, Cu—Mg based, Cu—Sn based, Cu—Si based, Cu—Mn based, Cu—Be—Co based, Cu—Ti based, Cu—Ni—Si based, Cu—Zn—Ni based, Cu—Cr based, Cu—Zr based, Cu—Fe based, Cu—Al based, Cu—Zn based, and Cu—Co based. Examples of other alloys include an aluminum alloy (Al—Si alloy), a nickel alloy (Ni—Cr alloy), and an iron alloy (Fe—Ni alloy, stainless steel, or steel). Of these metals, copper and a copper alloy are preferable.

Examples of the resin material constituting the resin layer formed on the chemical film include nylon, an acrylate resin, an epoxy resin, a polybenzoxazole resin, a silicone resin, a polyimide resin, a bismaleimide resin, a maleimide resin, a cyanate resin, a polyphenylene ether resin, a polyphenylene oxide resin, a polybutadiene resin, an olefin resin, a fluorine-containing resin, a polyetherimide resin, a polyether ether ketone resin, and a liquid crystal resin. The resin material may be a combination of these resin materials by mixing or modifying with each other. Of these resin materials, a polyphenylene ether resin, a polyphenylene oxide resin, a liquid crystal resin, an acrylate resin, an epoxy resin, an olefin resin, a polybenzoxazole resin, a silicone resin, and a polyimide resin are preferable.

Bonding Method

The method of bonding the metal and the resin material is not particularly limited as long as the surface treatment liquid of the present invention is used, and can be performed, for example, by the following method. The surface treatment liquid of the present invention is brought into contact with a surface of a metal to form a chemical film on the surface of the metal, and then a resin layer (for example, a base material) made of a resin material is formed on the surface of the metal via the chemical film. The method for forming the resin layer is not particularly limited as long as a resin layer made of a resin material is formed on a part or the whole of the chemical film, and examples thereof include a method of applying or pressure-bonding a resin material, a method of bonding a resin material with an adhesive or an adhesive sheet (film), and a method of combining these means.

Method for Manufacturing Printed Wiring Board

The present invention also provides a method for manufacturing a printed wiring board using the bonding method. That is, the method for manufacturing a printed wiring board according to the present invention includes a step of bringing the surface treatment liquid of the present invention into contact with a surface of a metal circuit of a printed wiring board to form a chemical film. The metal circuit of the printed wiring board is a metal (that is, wiring) constituting a circuit in the printed wiring board.

By forming a chemical film on the surface of a metal using the surface treatment liquid of the present invention, adhesiveness to a resin material can be enhanced, and therefore, the chemical film can be suitably used for various electric and electronic components in which a metal and a resin material are composited, and electronic devices including printed wiring boards and the like.

In the present invention, the surface treatment liquid of the present invention can be suitably used to a base material formed of particularly copper or a copper alloy. The surface treatment liquid of the present invention is suitable, for example, for surface treatment of copper or a copper alloy for the purpose of enhancing adhesiveness (adhesion property) between a copper circuit (copper wiring layer) and a prepreg or solder resist (insulating resin layer), and the adhesiveness between the copper wiring layer and the insulating resin layer can be enhanced in the printed wiring board having the insulating resin layer in contact with the copper wiring layer.

Specifically, the printed wiring board can be produced by bringing the surface treatment liquid of the present invention into contact with a surface of the copper wiring layer, then washing with water as necessary, subsequently drying, and then forming an insulating resin layer on the surface of the copper wiring layer.

The contact method is as described above, and immersion of the copper wiring layer in the surface treatment liquid, spraying of the treatment liquid onto the copper wiring layer, or the like is preferred because of simplicity and reliability.

The method of washing with water is also not particularly limited, and immersion of the copper wiring layer in washing water or spraying of washing water onto the surface of the copper wiring layer is preferred because of simplicity and reliability.

For the formation of the insulating resin layer, a known method, for example, a method of affixing a semi-cured resin material, a method of applying a liquid resin material containing a solvent, or the like can be adopted.

Next, a via hole is formed in order to conduct the upper and lower wirings. By repeating this process, a multilayer printed wiring board can be produced.

The copper wiring layer may be produced by a method such as an electroless plating method, an electrolytic plating method, a vapor deposition method, a sputtering method, or a damascene method, or may contain an inner via hole, a through hole, a connection terminal, or the like.

The "copper" according to the present invention is used in applications and forms, such as a foil (electrolytic copper foil, rolled copper foil, resin-attached copper foil, ultrathin electrolytic copper foil, electroless copper foil, sputtered copper foil, or thin copper foil), a plating film (electroless copper plating film or electrolytic copper plating film), a thin film formed by a vapor deposition method, a sputtering method, a damascene method, or the like, a grain, a needle, a fiber, a wire, a rod, a tube, or a plate, which are used in electronic devices such as a printed wiring board and a lead frame, an ornament, or a building material. In the case of a recent copper wiring layer through which a high-frequency electric signal flows, the surface of copper is preferably a smooth surface having an average roughness of 0.1 μm or less. The surface of copper may be plated with nickel, zinc, chromium, tin, or the like as a pretreatment.

The ultrathin electrolytic copper foil to be treated with the surface treatment liquid of the present invention is an ultrathin electrolytic copper foil to be used in a printed wiring board obtained by a method including a step of forming a circuit by any of a semi-additive method, a subtractive method, a partly additive method, a modified semi-additive method, an advanced modified semi-additive method, and a primer semi-additive method. The ultrathin electrolytic copper foil may include a copper foil carrier, a release layer laminated on the copper foil carrier, and an ultrathin copper layer laminated on the release layer. The copper surface may be subjected to at least one pretreatment selected from the group consisting of pickling treatment, roughening treatment, heat resistance treatment, rust prevention treatment, and chemical conversion treatment.

Other application examples of the surface treatment liquid for metal according to the present invention are shown below.

For example, in an application example in a semiconductor wafer, the surface treatment liquid for metal according to the present invention is suitable for surface treatment of a semiconductor circuit for the purpose of enhancing adhesiveness (adhesion property) between a semiconductor circuit formed on a semiconductor wafer and a protective film (for example, an insulating protective film such as a photosensitive positive type, a photosensitive negative type, or a non-photosensitive buffer coat or a bump protective film).

Further, for example, the surface treatment liquid for metal according to the present invention is suitable for surface treatment of a copper circuit rewiring layer for the purpose of enhancing adhesiveness (adhesion property) between a copper circuit rewiring layer and an insulating material in a package substrate (WL-CSP or FO-WLP) or a 2.5 dimensional (2.5D) interposer substrate for forming a rewiring layer on a semiconductor wafer.

Further, for example, in an application example in a lead frame at the time of wire bonding mounting, the surface treatment liquid for metal according to the present invention is suitable for surface treatment of a lead frame for the purpose of enhancing adhesiveness (adhesion property) to a sealing resin or an adhesive at the time of mounting a semiconductor chip in a metal surface in a lead frame forming step or in a frame metal surface having the semiconductor chip mounted thereon (before and after die bonding and pre-baking steps), a frame metal surface mounted by wire bonding, or a frame metal surface in a step before resin sealing (before and after a resin molding and baking step).

Further, for example, in an application example in a lead frame at the time of flip-chip mounting, the surface treatment liquid for metal according to the present invention is suitable for surface treatment of a lead frame for the purpose of enhancing adhesiveness (adhesion property) to a sealing resin or an adhesive at the time of mounting a semiconductor chip in a metal surface in a lead frame forming step or in a lead frame metal surface having a bonding material (solder, Au plating, Sn plating, etc.) temporarily placed thereon, a frame metal surface having the semiconductor chip mounted thereon (before and after alignment, chip mount, and baking steps), a lead frame metal surface actually cured (before and after reflow heating, thermocompression bonding, ultrasonic, plasma, and other steps), or a lead frame metal surface in a step before resin sealing.

Further, for example, in an application example in a fine wiring substrate in which an integration technology for closely arranging semiconductor chips is enhanced, the surface treatment liquid for metal according to the present invention is also suitable for surface treatment of a copper circuit wiring layer for the purpose of enhancing adhesiveness (adhesion property) between the copper circuit wiring layer and an insulating material in a 2.1 dimensional (2.1D) organic substrate or glass substrate, a component built-in substrate (EPS substrate) in which a semiconductor is built in a substrate, and a coreless substrate.

Further, for example, the surface treatment liquid for metal according to the present invention is suitable for surface treatment of a copper circuit wiring layer for the purpose of enhancing adhesiveness (adhesion property) between the copper circuit wiring layer and an insulating material in a case where pattern wiring is built in, upper and lower layers are subjected to laser via processing, and via fill plating is performed, or in a case where copper pillars formed by plating are used for conduction between the upper and lower layers, and a circuit embedded substrate (ETS) using MIS that uses a mold resin is used for an insulating layer.

EXAMPLES

While in the following, the present invention will be specifically described with reference to Examples and Comparative Examples, the present invention is not limited thereto.

[Materials Used]

Azole Silane Coupling Agent:

The following azole silane coupling agents AS-1 to AS-8 were used.

TABLE 1

| Azole silane coupling agent | Structural formula | Name |
|---|---|---|
| AS-1 | | 3,5-Diamino-1-[3-(triethoxysilyl)propyl]-1,2,4-triazole |
| AS-2 | | 3,5-Dimethyl-1-[3-(trimethoxysilyl)propyl]-1,2,4-triazole |
| AS-3 | | 1-[3-(Trimethoxysilyl)propyl]-1,2,4-triazole |
| AS-4 | | 5-Amino-1-[3-(trimethoxysilyl)propyl]-1H-tetrazole<br>5-Amino-2-[3-(trimethoxysilyl)propyl]-2H-tetrazole<br>*Mixture of isomers |
| AS-5 | | 5-Phenyl-1-[3-(triethoxysilyl)propyl]-1H-tetrazole<br>5-Phenyl-2-[3-(triethoxysilyl)propyl]-2H-tetrazole<br>*Mixture of isomers |
| AS-6 | | 3,5-Diamino-1-[1-(triethoxysilyl)methyl]-1,2,4-triazole |
| AS-7 | | 3-Ethyl-1-[3-(trimethoxysilyl)propyl]-1,2,4-triazole |
| AS-8 | | 1-[3-(Triethoxysilyl)propyl]-1,2,3-triazole |

(Azole Silane Coupling Agent AS-1)

The azole silane coupling agent AS-1 was synthesized by the following synthesis method.

The synthesis method was performed in accordance with WO 2018/186476.

Specifically, to a suspension containing of 15.6 g (0.157 mol) of 3,5-diamino-1,2,4-triazole and 100 mL of dehydrated N,N-dimethylformamide was added 53.5 g (0.157 mol) of a 20% sodium ethoxide ethanol solution at room temperature, and the whole was heated to 55 to 60° C. and stirred for 20 minutes. Thereafter, thereto was added 37.9 g (0.157 mol) of 3-chloropropyltriethoxysilane, followed by stirring at 87 to 90° C. for 6 hours. After the reaction mixture in the form of suspension was cooled to 3° C., insoluble matter was removed by filtration, and the solvent in the filtrate was distilled off under reduced pressure, to thereby obtain 42.3 g (0.139 mol, 88.8% yield) of a brown viscous substance.

$^1$H-NMR spectrum data of the obtained viscous substance were as follows.

$^1$H-NMR (DMSO-$d_6$) δ: 0.49 (t, 2H), 1.14 (t, 9H), 1.62 (m, 2H), 3.56 (t, 2H), 3.73 (q, 6H), 4.67 (s, 2H), 5.11 (s, 2H).

From the $^1$H-NMR spectrum data, the obtained viscous substance was identified to be the titled triazole silane compound represented by the above structural formula.

(Azole Silane Coupling Agent AS-2)

The azole silane coupling agent AS-2 was synthesized by the following synthesis method.

The synthesis method was performed in accordance with WO 2018/186476.

Specifically, to a solution containing 10.5 g (0.108 mol) of 3,5-dimethyl-1,2,4-triazole and 60 mL of dehydrated N,N-dimethylformamide was added 20.7 g (0.107 mol) of a 28% sodium methoxide methanol solution at room temperature, followed by stirring for 20 minutes. Thereafter, thereto was added 21.6 g (0.109 mol) of 3-chloropropyltrimethoxysilane, followed by stirring at 90 to 93° C. for 4 hours. After the reaction mixture in the form of suspension was cooled to 2° C., insoluble matter was removed by filtration, subsequently the solvent in the filtrate was distilled off under reduced pressure, and a small amount of insoluble matter formed was removed by filtration, to thereby obtain 24.6 g (0.095 mol, 87.8% yield) of a slightly brown liquid.

$^1$H-NMR spectrum data of the obtained slightly pink liquid were as follows.

$^1$H-NMR (DMSO-$d_6$) δ: 0.54 (t, 2H), 1.76 (m, 2H), 2.15 (s, 3H), 2.31 (s, 3H), 3.47 (s, 9H), 3.94 (t, 2H).

From the $^1$H-NMR spectrum data, the obtained slightly pink liquid was identified to be the titled azole silane compound represented by the above structural formula.

(Azole Silane Coupling Agent AS-3)

The azole silane coupling agent AS-3 was synthesized by the following synthesis method.

The synthesis method was performed in accordance with US 2012/0021232 A.

Specifically, to a solution containing 14.2 g (0.203 mol) of 1H-tetrazole and 80 mL of dehydrated N,N-dimethylformamide was added 39.2 g (0.203 mol) of a 28% sodium methoxide methanol solution at room temperature, followed by stirring for 30 minutes. Subsequently, thereto was added dropwise 40.3 g (0.203 mol) of 3-chloropropyltrimethoxysilane over 30 minutes, followed by stirring at 88 to 91° C. for 4 hours. The reaction mixture in the form of suspension was then cooled to 3° C., and insoluble matter was removed by filtration. Thereafter, volatile contents (solvent, etc.) were distilled off under reduced pressure, to thereby obtain 44.2 g (0.190 mol, 93.7% yield) of a colorless liquid.

$^1$H-NMR spectrum data of the obtained colorless liquid were as follows.

$^1$H-NMR (DMSO-$d_6$) δ: 0.57 (t, 2H, J=6 Hz, —CH2-Si), 1.96 (m, 2H, —CH2CH2-Si), 3.47 (s, 9H, SiOCH3), 4.43 (t, 1.1H, J=6.8 Hz, NCH2-), 4.68 (t, 0.9H, J=6.8 Hz, NCH2-), 8.96 (s, 0.55H, tetrazole ring C—H), 9.41 (s, 0.45H, tetrazole ring C—H).

From the $^1$H-NMR spectrum data, the obtained colorless liquid was identified to be the titled azole silane compound represented by the above structural formula.

(Azole Silane Coupling Agent AS-4)

The azole silane coupling agent AS-4 was synthesized by the following synthesis method.

The synthesis method was performed in accordance with WO 2019/058773.

Specifically, to a solution containing 23.0 g (0.270 mol) of 5-amino-1H-tetrazole and 200 mL of dehydrated N,N-dimethylformamide was added 51.9 g (0.270 mol) of a 28% sodium methoxide methanol solution at room temperature, followed by stirring for 30 minutes. Subsequently, thereto was added 53.7 g (0.270 mol) of 3-chloropropyltrimethoxysilane, followed by stirring at 89 to 92° C. for 22 hours. The reaction mixture in the form of suspension was cooled to 8° C., and insoluble matter was removed by filtration. Thereafter, volatile contents (solvent, etc.) were distilled off under reduced pressure to obtain 100 g of a concentrate. The concentrate was diluted with 150 mL of isopropyl acetate and washed three times with 150 mL of saturated salt solution, and the organic layer was dried over magnesium sulfate. Then, volatile contents (solvent, etc.) were distilled off under reduced pressure to obtain 58.3 g of a liquid concentrate. The concentrate was washed twice with 100 mL of hexane, and concentrated under reduced pressure, to thereby obtain 54.7 g (0.221 mol, 81.9% yield) of a white waxy solid.

$^1$H-NMR spectrum data of the obtained white waxy solid were as follows.

$^1$H-NMR (DMSO-$d_6$) δ: 0.54 (t, 2H, J=8 Hz, —CH2-Si), 1.75 (m, 0.8H, —CH2CH2-Si), 1.88 (m, 1.2H, —CH2CH2-Si), 3.47 (s, 9H, SiOCH3), 4.05 (t, 0.8H, J=7 Hz, NCH2-), 4.35 (t, 1.2H, J=7 Hz, NCH2-), 5.98 (s, 1.2H, NH2), 6.66 (s, 0.8H, NH2).

From the $^1$H-NMR spectrum data, the obtained white waxy solid was identified to be the titled azole silane compound represented by the above structural formula.

(Azole Silane Coupling Agent AS-5)

The azole silane coupling agent AS-5 was synthesized by the following synthesis method.

The synthesis method was performed in accordance with WO 2019/058773.

Specifically, to a solution containing 18.1 g (0.124 mol) of 5-phenyl-1H-tetrazole and 100 mL of dehydrated N,N-dimethylformamide was added 4.9 g (0.129 mol) of sodium hydride (oily, 63%) in three times at room temperature, followed by stirring for 30 minutes. Subsequently, thereto was added 29.9 g (0.124 mol) of 3-chloropropyltriethoxysilane, followed by stirring at 88 to 90° C. for 4 hours. The reaction mixture in the form of suspension was cooled to 3° C., and insoluble matter was removed by filtration. Thereafter, volatile contents (solvent and others) were distilled off under reduced pressure to obtain a concentrate. The concentrate was diluted (dispersed/dissolved) with 150 mL of isopropyl acetate and washed three times with 100 mL of saturated salt solution, and the organic layer was dried over magnesium sulfate. Then, volatile contents (solvent, etc.)

were distilled off under reduced pressure, to thereby obtain 38.9 g of a pale yellowish brown liquid (0.111 mol, 89.7% yield).

$^1$H-NMR spectrum data of the obtained pale yellowish brown liquid were as follows.

$^1$H-NMR (DMSO-d$_6$) δ: 0.59 (t, 2H, J=8 Hz, —CH2-Si), 1.14 (t, 9H, J=7 Hz, CH3), 2.05 (m, 2H, —CH2CH2-Si), 3.75 (q, 6H, J=7 Hz, Si—O—CH2-), 4.52 (t, 0.2H, J=7 Hz, NCH2-), 4.73 (t, 1.8H, J=7 Hz, NCH2-), 7.56 (m, 3H, Ph), 8.08 (m, 2H, Ph).

From the $^1$H-NMR spectrum data, the obtained pale yellowish brown liquid was identified to be the titled azole silane compound represented by the above structural formula.

(Azole Silane Coupling Agent AS-6)

The azole silane coupling agent AS-6 was synthesized by the following synthesis method.

Specifically, 90 mL of dehydrated N,N-dimethylacetamide, 45.2 g (0.118 mol) of a 20% sodium ethoxide ethanol solution, and then 11.7 g (0.118 mol) of 3,5-diamino-1,2,4-triazole were charged in this order, followed by heating to 70° C. and stirring for 1 hour. Subsequently, ethanol alone was distilled off under reduced pressure. Then, thereto was added dropwise 25.2 g (0.119 mol) of (chloromethyl)triethoxysilane at 70 to 75° C. over 20 minutes, followed by stirring at 100 to 102° C. for 18 hours. The reaction mixture in the form of suspension was filtered at the time of heating to remove insoluble matter, and the solvent in the filtrate was then distilled off under reduced pressure to obtain a brown viscous substance. The brown viscous substance was heated to reflux with 150 mL of acetonitrile and then crystallized. The suspension was cooled and then filtered, to thereby obtain 10.5 g (0.038 mol, 32.2% yield) of a deliquescent solid.

$^1$H-NMR spectrum data of the obtained deliquescent solid were as follows.

$^1$H-NMR (DMSO-d$_6$) δ: 1.06 (t, 9H), 2.24 (s, 2H), 3.60 (q, 6H), 5.18 (s, 2H), 5.77 (s, 2H).

From the $^1$H-NMR spectrum data, the obtained deliquescent solid was identified to be the titled azole silane compound represented by the above formula.

(Azole Silane Coupling Agent AS-7)

The azole silane coupling agent AS-7 was synthesized by the following synthesis method.

Specifically, 100 mL of dehydrated N,N-dimethylacetamide, 94.4 g (0.277 mol) of a 20% sodium ethoxide ethanol solution, and then 27.0 g (0.278 mol) of 3-ethyl-1,2,4-triazole were charged in this order, followed by heating to 70° C. and stirring for 1 hour. Subsequently, ethanol alone was distilled off under reduced pressure. Then, thereto was added dropwise 66.9 g (0.278 mol) of 3-chloropropyltriethoxysilane at 70 to 75° C. over 20 minutes, followed by stirring at 100 to 102° C. for 20 hours. The reaction mixture in the form of suspension was cooled to 2° C. and insoluble matter was removed by filtration. Thereafter, the solvent in the filtrate was distilled off under reduced pressure, to thereby obtain 74.0 g (0.257 mol, 92.8% yield) of a pale brown liquid.

$^1$H-NMR spectrum data of the obtained pale brown liquid were as follows.

$^1$H-NMR (DMSO-d$_6$) δ: 0.46 (t, 2H), 1.14 (t, 9H), 1.15 (t, 3H), 1.78 (m, 2H), 2.60 (q, 2H), 3.73 (q, 6H), 4.05 (t, 2H), 8.31 (s, 1H).

From the $^1$H-NMR spectrum data, the obtained pale brown liquid was identified to be the titled azole silane compound represented by the above structural formula.

(Azole Silane Coupling Agent AS-8)

The azole silane coupling agent AS-8 was synthesized by the following synthesis method.

Specifically, to a solution containing 12.5 g (0.181 mol) of 1,2,3-triazole and 100 mL of dehydrated N,N-dimethylformamide was added 62.1 g (0.183 mol) of a 20% sodium ethoxide ethanol solution at room temperature. Thereafter, thereto was added 44.0 g (0.183 mol) of 3-chloropropyltriethoxysilane, followed by stirring at 89 to 92° C. for 6 hours. The reaction mixture in the form of suspension was returned to room temperature, and insoluble matter was removed by filtration. Thereafter, volatile contents (solvent, etc.) were distilled off under reduced pressure to obtain 65 g of a concentrate. The concentrate was diluted (dispersed/dissolved) with 150 mL of isopropyl acetate and washed twice with 150 mL of saturated salt solution, and the organic layer was dried over magnesium sulfate. Then, volatile contents (solvent, etc.) were distilled off under reduced pressure, to thereby obtain 44.4 g of a brown clear liquid (0.162 mol, 89.7% yield).

$^1$H-NMR spectrum data of the obtained brown clear liquid were as follows.

$^1$H-NMR (DMSO-d$_6$) δ: 0.50 (t, 2H), 1.16 (t, 9H), 2.10 (m, 2H), 3.73 (q, 6H), 4.40 (t, 2H), 7.49 (s, 1H), 7.52 (s, 1H).

From the $^1$H-NMR spectrum data, the obtained brown clear liquid was identified to be the titled azole silane compound represented by the above structural formula.

As additive components of the surface treatment liquid, the following acids, salts, alkalis, copper compounds, and additives were used.

Acid:

Sulfuric acid, formic acid, acetic acid, or tosylic acid was used. At the time of preparing the surface treatment liquid, a 70% aqueous sulfuric acid solution was used as sulfuric acid, a 76% aqueous formic acid solution was used as formic acid, a 99% aqueous acetic acid solution was used as acetic acid, and tosylic acid monohydrate was used as tosylic acid. Sulfuric acid is an inorganic acid compound (b), and formic acid, acetic acid, and tosylic acid monohydrate are organic acid compounds (a).

Salt:

Anhydrous sodium sulfate (Na$_2$SO$_4$), sodium chloride, sodium nitrate, potassium sulfate, ammonium sulfate, and calcium sulfate were used. Anhydrous sodium sulfate, sodium chloride, sodium nitrate, and potassium sulfate are inorganic acid compounds (b) and alkali metal compounds (c1). Ammonium sulfate is an inorganic acid compound (b) and an ammonium compound (c2). Calcium sulfate is an inorganic acid compound (b).

Alkali:

Sodium hydroxide, potassium hydroxide, ammonia, tetramethylammonium hydroxide (TMAH), and calcium hydroxide were used. At the time of preparing the surface treatment liquid, a 48% aqueous sodium hydroxide solution was used as sodium hydroxide. Potassium hydroxide and calcium hydroxide were used in the form of granules. As ammonia, 25% aqueous ammonia was used. As tetramethylammonium hydroxide, a 25% aqueous tetramethylammonium hydroxide solution was used. Sodium hydroxide and potassium hydroxide are alkali metal compounds (c1). Ammonia is an ammonium compound (c2).

Copper Compound:

Copper formate tetrahydrate or copper sulfate pentahydrate was used. Copper formate tetrahydrate is an organic acid compound (a) and a copper compound (d), and copper sulfate pentahydrate is an inorganic acid compound (b) and a copper compound (d).

Additive: Ethylene glycol monobutyl ether (EGBE) was used. As ethylene glycol monobutyl ether, 98% ethylene glycol monobutyl ether was used.

Examples 1 to 45 and Comparative Examples 1 to 17

(Method for Preparing Surface Treatment Liquid)

Into a beaker containing ion-exchanged water, a predetermined amount of each of an azole silane coupling agent and an additive component excluding an alkali was fed as shown in Tables 2A to 12A, followed by stirring until the mixture became uniform. Thereafter, an alkali was fed thereinto and stirred until the mixture became uniform to adjust the pH to a predetermined pH, thereby obtaining a surface treatment liquid.

The atomic concentration of silicon, the concentration of the organic acid ion, the concentration of the inorganic acid ion, the total concentration of the alkali metal ion and the ammonium ion, the concentration of the copper ion, and the pH in the surface treatment liquid were as shown in Tables 2B to 12B.

When there was turbidity in the surface treatment liquid, the surface treatment liquid was filtered with diatomaceous earth to obtain a clear surface treatment liquid. After filtration and standing for one day, the surface treatment liquid having clarity was evaluated as "A", and the surface treatment liquid in which turbidity was generated after standing was evaluated as "B".

(Surface Treatment Method)

The surface of a copper plate was treated into a clean state using a potassium persulfate-based soft etching agent (GB-200; made by Shikoku Chemicals Corporation) as a pretreatment liquid.

The surface of the copper plate was washed with water, and the pretreatment liquid was sufficiently washed away.

Moisture on the surface of the copper plate was removed with an air knife.

The copper plate was immersed in a surface treatment liquid (30° C.) in a constant temperature state (surface treatment). The treatment time (i.e. immersion time) was 60 seconds.

Subsequently, the copper plate was washed with water to wash away the surface treatment liquid adhering to the surface of the copper plate.

Moisture on the surface of the copper plate was removed with an air knife.

The surface of the copper plate was dried with a dryer to remove moisture.

(Method of Measuring Film Thickness)

The film thickness was measured using an ultraviolet-visible spectrophotometer (UV-1800; made by Shimadzu Corporation).

Specifically, the copper plate treated with the surface treatment liquid was cut to have a predetermined area and placed in a beaker, a predetermined amount of an extraction liquid (5% aqueous hydrochloric acid solution) for dissolving a film was added thereto, and the beaker was shaken to dissolve the film generated on the copper surface.

The liquid in which the film was dissolved was measured with the ultraviolet-visible spectrophotometer, and its absorbance was read at a predetermined wavelength.

The film thickness was calculated from the film concentration of a sample liquid prepared from the absorbance value.

By comparing the film thicknesses of the samples treated under the same treatment conditions (for example, 30° C./60 seconds), a difference in film-forming speed was confirmed.

TABLE 2A

| | Azole silane coupling agent | | Acid | | Salt | | Alkali | | Copper compound | | Additive | |
|---|---|---|---|---|---|---|---|---|---|---|---|---|
| | Type | wt % | Type | wt % | Type | wt % | Type | wt % | Type | wt % | Type | wt % |
| Comparative Example 1 | AS-1 | 0.40 | 70% Sulfuric acid | 3.00 | — | — | 48% NaOH | 5.96 | Copper sulfate pentahydrate | 0.039 | — | — |
| Comparative Example 2 | AS-1 | 0.60 | 70% Sulfuric acid | 3.00 | — | — | 48% NaOH | 5.82 | Copper sulfate pentahydrate | 0.039 | — | — |
| Comparative Example 3 | AS-1 | 0.80 | 70% Sulfuric acid | 3.00 | — | — | 48% NaOH | 5.64 | Copper sulfate pentahydrate | 0.039 | — | — |
| Comparative Example 4 | AS-1 | 1.00 | 70% Sulfuric acid | 3.00 | — | — | 48% NaOH | 5.57 | Copper sulfate pentahydrate | 0.039 | — | — |
| Comparative Example 5 | AS-1 | 1.20 | 70% Sulfuric acid | 3.00 | — | — | 48% NaOH | 5.53 | Copper sulfate pentahydrate | 0.039 | — | — |
| Example 1 | AS-1 | 0.50 | 76% Formic acid | 6.32 | Na2SO4 | 3.00 | 48% NaOH | 6.13 | Copper sulfate pentahydrate | 0.059 | — | — |
| Example 2 | AS-1 | 0.80 | 76% Formic acid | 6.32 | Na2SO4 | 3.00 | 48% NaOH | 6.79 | Copper sulfate pentahydrate | 0.059 | — | — |

—: Not used.

TABLE 2B

| | | Silicon atom | | Organic acid ion | | Inorganic acid ion | | Alkali metal ion and ammonium ion | | Cu ion | | | Film-forming |
|---|---|---|---|---|---|---|---|---|---|---|---|---|---|
| | Clarity | wt % | mol/kg | wt % | mol/kg | wt % | mol/kg | wt % | mol/kg | wt % | mol/kg | pH | speed (1) |
| Comparative Example 1 | A | 0.037 | 0.013 | 0.00 | 0.00 | 2.07 | 0.22 | 1.65 | 0.72 | 0.010 | 0.0016 | 4.0 | 78 |
| Comparative Example 2 | A | 0.056 | 0.020 | 0.00 | 0.00 | 2.07 | 0.22 | 1.61 | 0.70 | 0.010 | 0.0016 | 4.0 | 99 |
| Comparative Example 3 | A | 0.074 | 0.026 | 0.00 | 0.00 | 2.07 | 0.22 | 1.56 | 0.68 | 0.010 | 0.0016 | 4.0 | 103 |

TABLE 2B-continued

|  | Clarity | Silicon atom wt % | Silicon atom mol/kg | Organic acid ion wt % | Organic acid ion mol/kg | Inorganic acid ion wt % | Inorganic acid ion mol/kg | Alkali metal ion and ammonium ion wt % | Alkali metal ion and ammonium ion mol/kg | Cu ion wt % | Cu ion mol/kg | pH | Film-forming speed (1) |
|---|---|---|---|---|---|---|---|---|---|---|---|---|---|
| Comparative Example 4 | A | 0.093 | 0.033 | 0.00 | 0.00 | 2.07 | 0.22 | 1.54 | 0.67 | 0.010 | 0.0016 | 4.0 | 104 |
| Comparative Example 5 | A | 0.111 | 0.040 | 0.00 | 0.00 | 2.07 | 0.22 | 1.53 | 0.66 | 0.010 | 0.0016 | 4.0 | 112 |
| Example 1 | A | 0.046 | 0.016 | 4.69 | 1.04 | 2.05 | 0.21 | 2.66 | 1.16 | 0.015 | 0.0024 | 4.0 | 124 |
| Example 2 | A | 0.074 | 0.026 | 4.69 | 1.04 | 2.05 | 0.21 | 2.84 | 1.24 | 0.015 | 0.0024 | 4.0 | 154 |

(1) nm (30° C./60 sec)

TABLE 3A

|  | Azole silane coupling agent Type | Azole silane coupling agent wt % | Acid Type | Acid wt % | Salt Type | Salt wt % | Alkali Type | Alkali wt % | Copper compound Type | Copper compound wt % | Additive Type | Additive wt % |
|---|---|---|---|---|---|---|---|---|---|---|---|---|
| Comparative Example 1 | AS-1 | 0.40 | 70% Sulfuric acid | 3.00 | — | — | 48% NaOH | 5.96 | Copper sulfate pentahydrate | 0.039 | — | — |
| Comparative Example 2 | AS-1 | 0.60 | 70% Sulfuric acid | 3.00 | — | — | 48% NaOH | 5.82 | Copper sulfate pentahydrate | 0.039 | — | — |
| Comparative Example 3 | AS-1 | 0.80 | 70% Sulfuric acid | 3.00 | — | — | 48% NaOH | 5.64 | Copper sulfate pentahydrate | 0.039 | — | — |
| Comparative Example 4 | AS-1 | 1.00 | 70% Sulfuric acid | 3.00 | — | — | 48% NaOH | 5.57 | Copper sulfate pentahydrate | 0.039 | — | — |
| Comparative Example 5 | AS-1 | 1.20 | 70% Sulfuric acid | 3.00 | — | — | 48% NaOH | 5.53 | Copper sulfate pentahydrate | 0.039 | — | — |
| Example 3 | AS-1 | 0.40 | 76% Formic acid | 6.58 | Na2SO4 | 3.00 | 48% NaOH | 7.00 | Copper formate tetrahydrate | 0.053 | — | — |
| Example 4 | AS-1 | 0.50 | 76% Formic acid | 6.63 | Na2SO4 | 3.00 | 48% NaOH | 7.31 | Copper sulfate pentahydrate | 0.059 | — | — |
| Example 5 | AS-1 | 0.60 | 76% Formic acid | 6.58 | Na2SO4 | 3.00 | 48% NaOH | 7.11 | Copper formate tetrahydrate | 0.053 | — | — |
| Example 6 | AS-1 | 0.80 | 76% Formic acid | 6.58 | Na2SO4 | 3.10 | 48% NaOH | 7.11 | Copper formate tetrahydrate | 0.036 | — | — |
| Example 7 | AS-1 | 0.80 | 76% Formic acid | 6.58 | Na2SO4 | 3.10 | 48% NaOH | 7.11 | Copper formate tetrahydrate | 0.053 | — | — |

—: Not used.

TABLE 3B

|  | Clarity | Silicon atom wt % | Silicon atom mol/kg | Organic acid ion wt % | Organic acid ion mol/kg | Inorganic acid ion wt % | Inorganic acid ion mol/kg | Alkali metal ion and ammonium ion wt % | Alkali metal ion and ammonium ion mol/kg | Cu ion wt % | Cu ion mol/kg | pH | Film-forming speed (1) |
|---|---|---|---|---|---|---|---|---|---|---|---|---|---|
| Comparative Example 1 | A | 0.037 | 0.013 | 0.00 | 0.00 | 2.07 | 0.22 | 1.65 | 0.72 | 0.010 | 0.0016 | 4.0 | 78 |
| Comparative Example 2 | A | 0.056 | 0.020 | 0.00 | 0.00 | 2.07 | 0.22 | 1.61 | 0.70 | 0.010 | 0.0016 | 4.0 | 99 |
| Comparative Example 3 | A | 0.074 | 0.026 | 0.00 | 0.00 | 2.07 | 0.22 | 1.56 | 0.68 | 0.010 | 0.0016 | 4.0 | 103 |
| Comparative Example 4 | A | 0.093 | 0.033 | 0.00 | 0.00 | 2.07 | 0.22 | 1.54 | 0.67 | 0.010 | 0.0016 | 4.0 | 104 |
| Comparative Example 5 | A | 0.111 | 0.040 | 0.00 | 0.00 | 2.07 | 0.22 | 1.53 | 0.66 | 0.010 | 0.0016 | 4.0 | 112 |
| Example 3 | A | 0.037 | 0.013 | 4.91 | 1.09 | 2.03 | 0.21 | 2.90 | 1.26 | 0.015 | 0.0024 | 4.5 | 107 |
| Example 4 | A | 0.046 | 0.016 | 4.93 | 1.10 | 2.05 | 0.21 | 2.99 | 1.30 | 0.015 | 0.0024 | 4.5 | 143 |
| Example 5 | A | 0.056 | 0.020 | 4.91 | 1.09 | 2.03 | 0.21 | 2.93 | 1.28 | 0.015 | 0.0024 | 4.5 | 132 |
| Example 6 | A | 0.074 | 0.026 | 4.90 | 1.09 | 2.10 | 0.22 | 2.97 | 1.29 | 0.010 | 0.0016 | 4.5 | 145 |
| Example 7 | A | 0.074 | 0.026 | 4.91 | 1.09 | 2.10 | 0.22 | 2.97 | 1.29 | 0.015 | 0.0024 | 4.5 | 180 |

(1) nm (30° C./60 sec)

TABLE 4A

|  | Azole silane coupling agent Type | Azole silane coupling agent wt % | Acid Type | Acid wt % | Salt Type | Salt wt % | Alkali Type | Alkali wt % | Copper compound Type | Copper compound wt % | Additive Type | Additive wt % |
|---|---|---|---|---|---|---|---|---|---|---|---|---|
| Example 8 | AS-1 | 0.50 | 76% Formic acid | 3.95 | Na2SO4 | 3.00 | 48% NaOH | 4.58 | Copper sulfate pentahydrate | 0.059 | — | — |
| Example 9 | AS-1 | 0.50 | 76% Formic acid | 5.26 | Na2SO4 | 3.00 | 48% NaOH | 6.20 | Copper sulfate pentahydrate | 0.059 | — | — |
| Example 10 | AS-1 | 0.50 | 76% Formic acid | 5.92 | Na2SO4 | 3.00 | 48% NaOH | 7.34 | Copper sulfate pentahydrate | 0.059 | — | — |
| Example 11 | AS-1 | 0.50 | 76% Formic acid | 6.58 | Na2SO4 | 3.00 | 48% NaOH | 7.70 | Copper sulfate pentahydrate | 0.059 | — | — |
| Example 12 | AS-1 | 0.50 | 76% Formic acid | 7.24 | Na2SO4 | 3.00 | 48% NaOH | 8.42 | Copper sulfate pentahydrate | 0.059 | — | — |

TABLE 4A-continued

| | Azole silane coupling agent | | Acid | | Salt | | Alkali | | Copper compound | | Additive | |
|---|---|---|---|---|---|---|---|---|---|---|---|---|
| | Type | wt % | Type | wt % | Type | wt % | Type | wt % | Type | wt % | Type | wt % |
| Example 13 | AS-1 | 0.50 | 76% Formic acid | 7.89 | Na2SO4 | 3.00 | 48% NaOH | 9.56 | Copper sulfate pentahydrate | 0.059 | — | — |
| Example 14 | AS-1 | 0.50 | 76% Formic acid | 13.16 | Na2SO4 | 3.00 | 48% NaOH | 16.10 | Copper sulfate pentahydrate | 0.059 | — | — |
| Comparative Example 1 | AS-1 | 0.40 | 70% Sulfuric acid | 3.00 | — | — | 48% NaOH | 5.96 | Copper sulfate pentahydrate | 0.039 | — | — |
| Comparative Example 2 | AS-1 | 0.60 | 70% Sulfuric acid | 3.00 | — | — | 48% NaOH | 5.82 | Copper sulfate pentahydrate | 0.039 | — | — |

—: Not used.

TABLE 4B

| | | Silicon atom | | Organic acid ion | | Inorganic acid ion | | Alkali metal ion and ammonium ion | | Cu ion | | | Film-forming |
|---|---|---|---|---|---|---|---|---|---|---|---|---|---|
| | Clarity | wt % | mol/kg | wt % | mol/kg | wt % | mol/kg | wt % | mol/kg | wt % | mol/kg | pH | speed (1) |
| Example 8 | A | 0.046 | 0.016 | 2.93 | 0.65 | 2.05 | 0.21 | 2.23 | 0.97 | 0.015 | 0.0024 | 5.0 | 122 |
| Example 9 | A | 0.046 | 0.016 | 3.91 | 0.87 | 2.05 | 0.21 | 2.68 | 1.17 | 0.015 | 0.0024 | 5.0 | 162 |
| Example 10 | A | 0.046 | 0.016 | 4.40 | 0.98 | 2.05 | 0.21 | 3.00 | 1.30 | 0.015 | 0.0024 | 5.0 | 173 |
| Example 11 | A | 0.046 | 0.016 | 4.89 | 1.09 | 2.05 | 0.21 | 3.10 | 1.35 | 0.015 | 0.0024 | 5.0 | 165 |
| Example 12 | A | 0.046 | 0.016 | 5.38 | 1.20 | 2.05 | 0.21 | 3.29 | 1.43 | 0.015 | 0.0024 | 5.0 | 174 |
| Example 13 | A | 0.046 | 0.016 | 5.87 | 1.30 | 2.05 | 0.21 | 3.61 | 1.57 | 0.015 | 0.0024 | 5.0 | 168 |
| Example 14 | B | 0.046 | 0.016 | 9.78 | 2.17 | 2.05 | 0.21 | 5.41 | 2.35 | 0.015 | 0.0024 | 5.0 | 160 |
| Comparative Example 1 | A | 0.037 | 0.013 | 0.00 | 0.00 | 2.07 | 0.22 | 1.65 | 0.72 | 0.010 | 0.0016 | 4.0 | 78 |
| Comparative Example 2 | A | 0.056 | 0.020 | 0.00 | 0.00 | 2.07 | 0.22 | 1.61 | 0.70 | 0.010 | 0.0016 | 4.0 | 99 |

(1) nm (30° C./60 sec)

TABLE 5A

| | Azole silane coupling agent | | Acid | | Salt | | Alkali | | Copper compound | | Additive | |
|---|---|---|---|---|---|---|---|---|---|---|---|---|
| | Type | wt % | Type | wt % | Type | wt % | Type | wt % | Type | wt % | Type | wt % |
| Example 15 | AS-1 | 0.80 | 76% Formic acid | 6.58 | Na2SO4 | 0.50 | 48% NaOH | 5.50 | Copper sulfate pentahydrate | 0.079 | — | — |
| Example 16 | AS-1 | 0.80 | 76% Formic acid | 6.58 | Na2SO4 | 1.00 | 48% NaOH | 5.50 | Copper sulfate pentahydrate | 0.079 | — | — |
| Example 17 | AS-1 | 0.80 | 76% Formic acid | 6.58 | Na2SO4 | 1.50 | 48% NaOH | 5.50 | Copper sulfate pentahydrate | 0.079 | — | — |
| Example 18 | AS-1 | 0.80 | 76% Formic acid | 6.58 | Na2SO4 | 2.00 | 48% NaOH | 5.50 | Copper sulfate pentahydrate | 0.079 | — | — |
| Example 19 | AS-1 | 0.80 | 76% Formic acid | 6.58 | Na2SO4 | 2.50 | 48% NaOH | 5.50 | Copper sulfate pentahydrate | 0.079 | — | — |
| Example 20 | AS-1 | 0.80 | 76% Formic acid | 6.58 | Na2SO4 | 3.00 | 48% NaOH | 5.50 | Copper sulfate pentahydrate | 0.079 | — | — |
| Example 21 | AS-1 | 0.80 | 76% Formic acid | 6.58 | Na2SO4 | 3.50 | 48% NaOH | 5.50 | Copper sulfate pentahydrate | 0.079 | — | — |
| Example 22 | AS-1 | 0.80 | 76% Formic acid | 6.58 | Na2SO4 | 4.00 | 48% NaOH | 5.50 | Copper sulfate pentahydrate | 0.079 | — | — |
| Comparative Example 3 | AS-1 | 0.80 | 70% Sulfuric acid | 3.00 | — | — | 48% NaOH | 5.64 | Copper sulfate pentahydrate | 0.039 | — | — |

—: Not used.

TABLE 5B

| | | Silicon atom | | Organic acid ion | | Inorganic acid ion | | Alkali metal ion and ammonium ion | | Cu ion | | | Film-forming |
|---|---|---|---|---|---|---|---|---|---|---|---|---|---|
| | Clarity | wt % | mol/kg | wt % | mol/kg | wt % | mol/kg | wt % | mol/kg | wt % | mol/kg | pH | speed (1) |
| Example 15 | A | 0.074 | 0.026 | 4.89 | 1.09 | 0.37 | 0.04 | 1.68 | 0.73 | 0.020 | 0.0031 | 5.0 | 118 |
| Example 16 | A | 0.074 | 0.026 | 4.89 | 1.09 | 0.71 | 0.07 | 1.84 | 0.80 | 0.020 | 0.0031 | 5.0 | 138 |
| Example 17 | A | 0.074 | 0.026 | 4.89 | 1.09 | 1.04 | 0.11 | 2.00 | 0.87 | 0.020 | 0.0031 | 5.0 | 153 |
| Example 18 | A | 0.074 | 0.026 | 4.89 | 1.09 | 1.38 | 0.14 | 2.16 | 0.94 | 0.020 | 0.0031 | 5.0 | 169 |
| Example 19 | A | 0.074 | 0.026 | 4.89 | 1.09 | 1.72 | 0.18 | 2.33 | 1.01 | 0.020 | 0.0031 | 5.0 | 175 |
| Example 20 | A | 0.074 | 0.026 | 4.89 | 1.09 | 2.06 | 0.21 | 2.49 | 1.08 | 0.020 | 0.0031 | 5.0 | 179 |

TABLE 5B-continued

|  | Clarity | Silicon atom wt % | Silicon atom mol/kg | Organic acid ion wt % | Organic acid ion mol/kg | Inorganic acid ion wt % | Inorganic acid ion mol/kg | Alkali metal ion and ammonium ion wt % | Alkali metal ion and ammonium ion mol/kg | Cu ion wt % | Cu ion mol/kg | pH | Film-forming speed (1) |
|---|---|---|---|---|---|---|---|---|---|---|---|---|---|
| Example 21 | A | 0.074 | 0.026 | 4.89 | 1.09 | 2.40 | 0.25 | 2.65 | 1.15 | 0.020 | 0.0031 | 5.0 | 182 |
| Example 22 | A | 0.074 | 0.026 | 4.89 | 1.09 | 2.74 | 0.28 | 2.81 | 1.22 | 0.020 | 0.0031 | 5.0 | 171 |
| Comparative Example 3 | A | 0.074 | 0.026 | 0.00 | 0.00 | 2.07 | 0.22 | 1.56 | 0.68 | 0.010 | 0.0016 | 4.0 | 103 |

(1) nm (30° C./60 sec)

TABLE 6A

|  | Azole silane coupling agent Type | Azole silane coupling agent wt % | Acid Type | Acid wt % | Salt Type | Salt wt % | Alkali Type | Alkali wt % | Copper compound Type | Copper compound wt % | Additive Type | Additive wt % |
|---|---|---|---|---|---|---|---|---|---|---|---|---|
| Example 1 | AS-1 | 0.50 | 76% Formic acid | 6.32 | Na2SO4 | 3.00 | 48% NaOH | 6.13 | Copper sulfate pentahydrate | 0.059 | — | — |
| Example 23 | AS-1 | 0.50 | 76% Formic acid | 7.03 | Na2SO4 | 3.00 | 48% NaOH | 7.31 | Copper sulfate pentahydrate | 0.059 | — | — |
| Example 24 | AS-1 | 0.50 | 76% Formic acid | 6.63 | Na2SO4 | 3.00 | 48% NaOH | 7.31 | Copper sulfate pentahydrate | 0.059 | — | — |
| Example 25 | AS-1 | 0.50 | 76% Formic acid | 6.58 | Na2SO4 | 3.00 | 48% NaOH | 7.54 | Copper sulfate pentahydrate | 0.059 | — | — |
| Example 11 | AS-1 | 0.50 | 76% Formic acid | 6.58 | Na2SO4 | 3.00 | 48% NaOH | 7.70 | Copper sulfate pentahydrate | 0.059 | — | — |
| Example 26 | AS-1 | 0.50 | 76% Formic acid | 5.66 | Na2SO4 | 3.00 | 48% NaOH | 7.31 | Copper sulfate pentahydrate | 0.059 | — | — |
| Comparative Example 1 | AS-1 | 0.40 | 70% Sulfuric acid | 3.00 | — | — | 48% NaOH | 5.96 | Copper sulfate pentahydrate | 0.039 | — | — |
| Comparative Example 2 | AS-1 | 0.60 | 70% Sulfuric acid | 3.00 | — | — | 48% NaOH | 5.82 | Copper sulfate pentahydrate | 0.039 | — | — |

—: Not used.

TABLE 6B

|  | Clarity | Silicon atom wt % | Silicon atom mol/kg | Organic acid ion wt % | Organic acid ion mol/kg | Inorganic acid ion wt % | Inorganic acid ion mol/kg | Alkali metal ion and ammonium ion wt % | Alkali metal ion and ammonium ion mol/kg | Cu ion wt % | Cu ion mol/kg | pH | Film-forming speed (1) |
|---|---|---|---|---|---|---|---|---|---|---|---|---|---|
| Example 1 | A | 0.046 | 0.016 | 4.69 | 1.04 | 2.05 | 0.21 | 2.66 | 1.16 | 0.015 | 0.0024 | 4.0 | 124 |
| Example 23 | A | 0.046 | 0.016 | 5.22 | 1.16 | 2.05 | 0.21 | 2.99 | 1.30 | 0.015 | 0.0024 | 4.3 | 126 |
| Example 24 | A | 0.046 | 0.016 | 4.93 | 1.10 | 2.05 | 0.21 | 2.99 | 1.30 | 0.015 | 0.0024 | 4.5 | 143 |
| Example 25 | A | 0.046 | 0.016 | 4.89 | 1.09 | 2.05 | 0.21 | 3.05 | 1.33 | 0.015 | 0.0024 | 4.7 | 147 |
| Example 11 | A | 0.046 | 0.016 | 4.89 | 1.09 | 2.05 | 0.21 | 3.10 | 1.35 | 0.015 | 0.0024 | 5.0 | 165 |
| Example 26 | B | 0.046 | 0.016 | 4.21 | 0.93 | 2.05 | 0.21 | 2.99 | 1.30 | 0.015 | 0.0024 | 5.5 | 140 |
| Comparative Example 1 | A | 0.037 | 0.013 | 0.00 | 0.00 | 2.07 | 0.22 | 1.65 | 0.72 | 0.010 | 0.0016 | 4.0 | 78 |
| Comparative Example 2 | A | 0.056 | 0.020 | 0.00 | 0.00 | 2.07 | 0.22 | 1.61 | 0.70 | 0.010 | 0.0016 | 4.0 | 99 |

(1) nm (30° C./60 sec)

TABLE 7A

|  | Azole silane coupling agent Type | Azole silane coupling agent wt % | Acid Type | Acid wt % | Salt Type | Salt wt % | Alkali Type | Alkali wt % | Copper compound Type | Copper compound wt % | Additive Type | Additive wt % |
|---|---|---|---|---|---|---|---|---|---|---|---|---|
| Example 6 | AS-1 | 0.80 | 76% Formic acid | 6.58 | Na2SO4 | 3.10 | 48% NaOH | 7.11 | Copper formate tetrahydrate | 0.036 | — | — |
| Example 27 | AS-1 | 0.50 | 76% Formic acid | 6.32 | Na2SO4 | 3.00 | 48% NaOH | 7.32 | Copper formate tetrahydrate | 0.053 | — | — |
| Example 28 | AS-1 | 0.50 | 76% Formic acid | 6.32 | Na2SO4 | 3.00 | 48% NaOH | 7.32 | Copper sulfate pentahydrate | 0.079 | — | — |
| Example 29 | AS-1 | 0.50 | 76% Formic acid | 6.32 | Na2SO4 | 3.00 | 48% NaOH | 7.32 | Copper sulfate pentahydrate | 0.118 | — | — |
| Example 30 | AS-1 | 0.50 | 76% Formic acid | 6.32 | Na2SO4 | 3.00 | 48% NaOH | 7.32 | Copper sulfate pentahydrate | 0.196 | — | — |
| Example 31 | AS-1 | 0.50 | 76% Formic acid | 6.32 | Na2SO4 | 3.00 | 48% NaOH | 7.32 | Copper sulfate pentahydrate | 0.275 | — | — |

TABLE 7A-continued

| | Azole silane coupling agent | | Acid | | Salt | | Alkali | | Copper compound | | Additive | |
|---|---|---|---|---|---|---|---|---|---|---|---|---|
| | Type | wt % | Type | wt % | Type | wt % | Type | wt % | Type | wt % | Type | wt % |
| Comparative Example 1 | AS-1 | 0.40 | 70% Sulfuric acid | 3.00 | — | — | 48% NaOH | 5.96 | Copper sulfate pentahydrate | 0.039 | — | — |
| Comparative Example 2 | AS-1 | 0.60 | 70% Sulfuric acid | 3.00 | — | — | 48% NaOH | 5.82 | Copper sulfate pentahydrate | 0.039 | — | — |

—: Not used.

TABLE 7B

| | | Silicon atom | | Organic acid ion | | Inorganic acid ion | | Alkali metal ion and ammonium ion | | Cu ion | | | Film-forming |
|---|---|---|---|---|---|---|---|---|---|---|---|---|---|
| | Clarity | wt % | mol/kg | wt % | mol/kg | wt % | mol/kg | wt % | mol/kg | wt % | mol/kg | pH | speed (1) |
| Example 6 | A | 0.074 | 0.026 | 4.90 | 1.09 | 2.10 | 0.22 | 2.97 | 1.29 | 0.010 | 0.0016 | 4.5 | 145 |
| Example 27 | A | 0.046 | 0.016 | 4.71 | 1.05 | 2.03 | 0.21 | 2.99 | 1.30 | 0.015 | 0.0024 | 4.7 | 103 |
| Example 28 | A | 0.046 | 0.016 | 4.69 | 1.04 | 2.06 | 0.21 | 2.99 | 1.30 | 0.020 | 0.0031 | 4.7 | 120 |
| Example 29 | A | 0.046 | 0.016 | 4.69 | 1.04 | 2.07 | 0.22 | 2.99 | 1.30 | 0.030 | 0.0047 | 4.7 | 120 |
| Example 30 | A | 0.046 | 0.016 | 4.69 | 1.04 | 2.10 | 0.22 | 2.99 | 1.30 | 0.050 | 0.0079 | 4.7 | 112 |
| Example 31 | A | 0.046 | 0.016 | 4.69 | 1.04 | 2.13 | 0.22 | 2.99 | 1.30 | 0.070 | 0.0110 | 4.7 | 108 |
| Comparative Example 1 | A | 0.037 | 0.013 | 0.00 | 0.00 | 2.07 | 0.22 | 1.65 | 0.72 | 0.010 | 0.0016 | 4.0 | 78 |
| Comparative Example 2 | A | 0.056 | 0.020 | 0.00 | 0.00 | 2.07 | 0.22 | 1.61 | 0.70 | 0.010 | 0.0016 | 4.0 | 99 |

(1) nm (30° C./60 sec)

TABLE 8A

Influence of type and presence/absence of organic acid ion

| | Azole silane coupling agent | | Acid | | Salt | | Alkali | | Copper compound | | Additive | |
|---|---|---|---|---|---|---|---|---|---|---|---|---|
| | Type | wt % | Type | wt % | Type | wt % | Type | wt % | Type | wt % | Type | wt % |
| Example 13 | AS-1 | 0.50 | 76% Formic acid | 7.89 | Na2SO4 | 3.00 | 48% NaOH | 9.56 | Copper sulfate pentahydrate | 0.059 | — | — |
| Example 32 | AS-1 | 0.50 | 99% Acetic acid | 9.00 | Na2SO4 | 3.00 | 48% NaOH | 12.08 | Copper sulfate pentahydrate | 0.079 | — | — |
| Comparative Example 6 | AS-1 | 0.50 | 70% Sulfuric acid | 0.52 | Na2SO4 | 3.00 | 48% NaOH | 1.00 | Copper sulfate pentahydrate | 0.079 | — | — |

—: Not used.

TABLE 8B

Influence of type and presence/absence of organic acid ion

| | | Silicon atom | | Organic acid ion | | Inorganic acid ion | | Alkali metal ion and ammonium ion | | Cu ion | | | Film-forming |
|---|---|---|---|---|---|---|---|---|---|---|---|---|---|
| | Clarity | wt % | mol/kg | wt % | mol/kg | wt % | mol/kg | wt % | mol/kg | wt % | mol/kg | pH | speed (1) |
| Example 13 | A | 0.046 | 0.016 | 5.87 | 1.30 | 2.05 | 0.21 | 3.61 | 1.57 | 0.015 | 0.0024 | 5.0 | 168 |
| Example 32 | A | 0.046 | 0.016 | 8.76 | 1.95 | 2.06 | 0.21 | 4.31 | 1.87 | 0.020 | 0.0032 | 6.0 | 100 |
| Comparative Example 6 | A | 0.046 | 0.016 | 0.00 | 0.00 | 2.42 | 0.25 | 1.25 | 0.54 | 0.020 | 0.0032 | 6.0 | 19 |

(1) nm (30° C./60 sec)

TABLE 9A

Influence of type and presence/absence of inorganic acid ion

| | Azole silane coupling agent | | Acid | | Salt | | Alkali | | Copper compound | | Additive | |
|---|---|---|---|---|---|---|---|---|---|---|---|---|
| | Type | wt % | Type | wt % | Type | wt % | Type | wt % | Type | wt % | Type | wt % |
| Example 33 | AS-1 | 0.50 | 76% Formic acid | 6.32 | Na2SO4 | 3.00 | 48% NaOH | 7.55 | Copper sulfate pentahydrate | 0.059 | — | — |
| Example 34 | AS-1 | 0.50 | 76% Formic acid | 6.32 | Na2SO4 | 1.50 | 48% NaOH | 7.75 | Copper sulfate pentahydrate | 0.059 | — | — |
| Example 35 | AS-1 | 0.50 | 76% Formic acid | 7.50 | NaCl | 1.23 | 48% NaOH | 9.33 | Copper formate tetrahydrate | 0.053 | — | — |
| Example 36 | AS-1 | 0.50 | 76% Formic acid | 7.00 | NaNO3 | 1.78 | 48% NaOH | 9.75 | Copper formate tetrahydrate | 0.053 | — | — |
| Comparative Example 7 | AS-1 | 0.50 | 76% Formic acid | 6.32 | — | — | 48% NaOH | 7.50 | Copper formate tetrahydrate | 0.053 | — | — |

—: Not used.

TABLE 9B

Influence of type and presence/absence of inorganic acid ion

| | | Silicon atom | | Organic acid ion | | Inorganic acid ion | | Alkali metal ion and ammonium ion | | Cu ion | | | Film-forming |
|---|---|---|---|---|---|---|---|---|---|---|---|---|---|
| | Clarity | wt % | mol/kg | wt % | mol/kg | wt % | mol/kg | wt % | mol/kg | wt % | mol/kg | pH | speed (1) |
| Example 33 | A | 0.046 | 0.016 | 4.70 | 1.04 | 2.05 | 0.21 | 3.06 | 1.33 | 0.015 | 0.0024 | 4.7 | 111 |
| Example 34 | A | 0.046 | 0.016 | 4.70 | 1.04 | 1.04 | 0.11 | 2.62 | 1.14 | 0.015 | 0.0024 | 4.7 | 108 |
| Example 35 | B | 0.046 | 0.016 | 5.58 | 1.24 | 0.75 | 0.08 | 3.06 | 1.33 | 0.015 | 0.0023 | 6.0 | 106 |
| Example 36 | A | 0.046 | 0.016 | 5.20 | 1.16 | 1.30 | 0.14 | 3.17 | 1.38 | 0.015 | 0.0023 | 6.0 | 110 |
| Comparative Example 7 | A | 0.046 | 0.016 | 4.71 | 1.05 | 0.00 | 0.00 | 2.07 | 0.90 | 0.015 | 0.0023 | 4.7 | 59 |

(1) nm (30° C./60 sec)

TABLE 10A

Influence of types and presence/absence of alkali metal ion and ammonium ion

| | Azole silane coupling agent | | Acid | | Salt | | Alkali | | Copper compound | | Additive | |
|---|---|---|---|---|---|---|---|---|---|---|---|---|
| | Type | wt % | Type | wt % | Type | wt % | Type | wt % | Type | wt % | Type | wt % |
| Example 33 | AS-1 | 0.50 | 76% Formic acid | 6.32 | Na2SO4 | 3.00 | 48% NaOH | 7.55 | Copper sulfate pentahydrate | 0.059 | — | — |
| Example 37 | AS-1 | 0.50 | 76% Formic acid | 6.32 | K2SO4 | 3.68 | KOH | 5.70 | Copper sulfate pentahydrate | 0.059 | — | — |
| Example 38 | AS-1 | 0.50 | 76% Formic acid | 6.32 | (NH4)2SO4 | 2.75 | 25% NH3 | 16.90 | Copper sulfate pentahydrate | 0.059 | — | — |
| Comparative Example 8 | AS-1 | 0.50 | 76% Formic acid | 6.32 | — | — | 25% TMAH | 67.35 | Copper sulfate pentahydrate | 0.059 | — | — |
| Comparative Example 9 | AS-1 | 0.50 | 76% Formic acid | 6.32 | CaSO4 | 3.65 | Ca(OH)2 | 3.60 | Copper sulfate pentahydrate | 0.059 | — | — |

—: Not used.

TABLE 10B

Influence of types and presence/absence of alkali metal ion and ammonium ion

| | | Silicon atom | | Organic acid ion | | Inorganic acid ion | | Alkali metal ion and ammonium ion | | Cu ion | | | Film-forming |
|---|---|---|---|---|---|---|---|---|---|---|---|---|---|
| | Clarity | wt % | mol/kg | wt % | mol/kg | wt % | mol/kg | wt % | mol/kg | wt % | mol/kg | pH | speed (1) |
| Example 33 | A | 0.046 | 0.016 | 4.70 | 1.04 | 2.05 | 0.21 | 3.06 | 1.33 | 0.015 | 0.0024 | 4.7 | 111 |
| Example 37 | A | 0.046 | 0.016 | 4.70 | 1.04 | 2.05 | 0.21 | 5.62 | 1.44 | 0.015 | 0.0024 | 4.7 | 119 |
| Example 38 | A | 0.046 | 0.016 | 4.70 | 1.04 | 2.02 | 0.21 | 4.98 | 2.92 | 0.015 | 0.0024 | 4.7 | 132 |
| Comparative Example 8 | A | 0.046 | 0.016 | 4.70 | 1.04 | 0.02 | 0.00 | 0.00 | 0.00 | 0.015 | 0.0024 | 4.7 | 30 |

TABLE 10B-continued

Influence of types and presence/absence of alkali metal ion and ammonium ion

| | Clarity | Silicon atom wt % | Silicon atom mol/kg | Organic acid ion wt % | Organic acid ion mol/kg | Inorganic acid ion wt % | Inorganic acid ion mol/kg | Alkali metal ion and ammonium ion wt % | Alkali metal ion and ammonium ion mol/kg | Cu ion wt % | Cu ion mol/kg | pH | Film-forming speed (1) |
|---|---|---|---|---|---|---|---|---|---|---|---|---|---|
| Comparative Example 9 | A | 0.046 | 0.016 | 4.70 | 1.04 | 2.60 | 0.27 | 0.00 | 0.00 | 0.015 | 0.0024 | 4.7 | 24 |

(1) nm (30° C./60 sec)

TABLE 11A

Influence of presence/absence of copper ion

| | Azole silane coupling agent Type | Azole silane coupling agent wt % | Acid Type | Acid wt % | Salt Type | Salt wt % | Alkali Type | Alkali wt % | Copper compound Type | Copper compound wt % | Additive Type | Additive wt % |
|---|---|---|---|---|---|---|---|---|---|---|---|---|
| Example 33 | AS-1 | 0.50 | 76% Formic acid | 6.32 | Na2SO4 | 3.00 | 48% NaOH | 7.55 | Copper sulfate pentahydrate | 0.059 | — | — |
| Comparative Example 10 | AS-1 | 0.50 | 76% Formic acid | 6.32 | Na2SO4 | 3.00 | 48% NaOH | 7.50 | — | — | — | — |

—: Not used.

TABLE 11B

Influence of presence/absence of copper ion

| | Clarity | Silicon atom wt % | Silicon atom mol/kg | Organic acid ion wt % | Organic acid ion mol/kg | Inorganic acid ion wt % | Inorganic acid ion mol/kg | Alkali metal ion and ammonium ion wt % | Alkali metal ion and ammonium ion mol/kg | Cu ion wt % | Cu ion mol/kg | pH | Film-forming speed (1) |
|---|---|---|---|---|---|---|---|---|---|---|---|---|---|
| Example 33 | A | 0.046 | 0.016 | 4.70 | 1.04 | 2.05 | 0.21 | 3.06 | 1.33 | 0.015 | 0.0024 | 4.7 | 111 |
| Comparative Example 10 | A | 0.046 | 0.016 | 4.70 | 1.04 | 2.03 | 0.21 | 3.04 | 1.32 | 0.000 | 0.0000 | 4.7 | 4 |

(1) nm (30° C./60 sec)

TABLE 12A

Influence of type of azole silane coupling agent and effect of tosylic acid (organic acid ion)

| | Azole silane coupling agent Type | Azole silane coupling agent wt % | Acid Type | Acid wt % | Salt Type | Salt wt % | Alkali Type | Alkali wt % | Copper compound Type | Copper compound wt % | Additive Type | Additive wt % |
|---|---|---|---|---|---|---|---|---|---|---|---|---|
| Example 39 | AS-2 | 0.43 | 76% Formic acid | 7.32 | Na2SO4 | 3.00 | 48% NaOH | 9.00 | Copper sulfate pentahydrate | 0.059 | — | — |
| Comparative Example 11 | AS-2 | 0.43 | 76% Formic acid | 6.32 | Na2SO4 | 3.00 | 48% NaOH | 7.75 | — | — | — | — |
| Example 40 | AS-3 | 0.38 | 76% Formic acid | 6.58 | Na2SO4 | 2.00 | 48% NaOH | 5.60 | Copper sulfate pentahydrate | 0.059 | — | — |
| Comparative Example 12 | AS-3 | 0.38 | 76% Formic acid | 6.58 | — | — | 48% NaOH | 5.60 | Copper formate tetrahydrate | 0.053 | — | — |
| Example 41 | AS-4 | 0.41 | Tosylic acid monohydrate | 5.40 | Na2SO4 | 1.50 | 48% NaOH | 5.00 | Copper sulfate pentahydrate | 0.059 | — | — |
| Comparative Example 13 | AS-4 | 0.41 | Tosylic acid monohydrate | 5.40 | Na2SO4 | 1.70 | 48% NaOH | 5.00 | — | — | — | — |
| Example 42 | AS-5 | 0.59 | 76% Formic acid | 6.32 | Na2SO4 | 3.00 | 48% NaOH | 8.00 | Copper sulfate pentahydrate | 0.059 | EGBE | 2.00 |
| Comparative Example 14 | AS-5 | 0.59 | 76% Formic acid | 6.32 | Na2SO4 | 3.00 | 48% NaOH | 8.00 | — | — | EGBE | 2.00 |
| Example 43 | AS-6 | 0.45 | 76% Formic acid | 6.58 | Na2SO4 | 1.50 | 48% NaOH | 7.25 | Copper sulfate pentahydrate | 0.059 | — | — |

TABLE 12A-continued

Influence of type of azole silane coupling agent and effect of tosylic acid (organic acid ion)

| | Azole silane coupling agent | | Acid | | Salt | | Alkali | | Copper compound | | Additive | |
|---|---|---|---|---|---|---|---|---|---|---|---|---|
| | Type | wt % | Type | wt % | Type | wt % | Type | wt % | Type | wt % | Type | wt % |
| Comparative Example 15 | AS-6 | 0.45 | 76% Formic acid | 6.58 | — | — | 48% NaOH | 7.25 | Copper formate tetrahydrate | 0.053 | — | — |
| Example 44 | AS-7 | 0.43 | 76% Formic acid | 7.89 | Na2SO4 | 1.50 | 48% NaOH | 7.25 | Copper sulfate pentahydrate | 0.059 | — | — |
| Comparative Example 16 | AS-7 | 0.43 | 76% Formic acid | 7.89 | Na2SO4 | 3.00 | 48% NaOH | 7.25 | — | — | — | — |
| Example 45 | AS-8 | 0.45 | 76% Formic acid | 12.63 | Na2SO4 | 3.00 | 48% NaOH | 36.31 | Copper sulfate pentahydrate | 0.059 | — | — |
| Comparative Example 17 | AS-8 | 0.45 | 76% Formic acid | 12.63 | Na2SO4 | 3.00 | 48% NaOH | 36.31 | — | — | — | — |

—: Not used.

TABLE 12B

Influence of type of azole silane coupling agent and effect of tosylic acid (organic acid ion)

| | | Silicon atom | | Organic acid ion | | Inorganic acid ion | | Alkali metal ion and ammonium ion | | Cu ion | | | Film-forming |
|---|---|---|---|---|---|---|---|---|---|---|---|---|---|
| | Clarity | wt % | mol/kg | wt % | mol/kg | wt % | mol/kg | wt % | mol/kg | wt % | mol/kg | pH | speed (1) |
| Example 39 | A | 0.046 | 0.016 | 5.44 | 1.21 | 2.05 | 0.21 | 3.46 | 1.50 | 0.015 | 0.0024 | 5.0 | 241 |
| Comparative Example 11 | A | 0.046 | 0.016 | 4.70 | 1.04 | 2.03 | 0.21 | 3.11 | 1.35 | 0.000 | 0.0000 | 5.0 | 48 |
| Example 40 | A | 0.046 | 0.016 | 4.89 | 1.09 | 1.38 | 0.14 | 2.19 | 0.95 | 0.015 | 0.0024 | 4.0 | 185 |
| Comparative Example 12 | A | 0.046 | 0.016 | 4.90 | 1.09 | 0.00 | 0.00 | 1.55 | 0.67 | 0.015 | 0.0023 | 4.0 | 84 |
| Example 41 | A | 0.047 | 0.017 | 4.86 | 0.28 | 1.04 | 0.11 | 1.87 | 0.81 | 0.015 | 0.0024 | 2.8 | 212 |
| Comparative Example 13 | A | 0.047 | 0.017 | 4.86 | 0.28 | 1.15 | 0.12 | 1.93 | 0.84 | 0.000 | 0.0000 | 2.8 | 4 |
| Example 42 | B | 0.046 | 0.016 | 4.70 | 1.04 | 2.05 | 0.21 | 3.18 | 1.38 | 0.015 | 0.0024 | 4.7 | 32 |
| Comparative Example 14 | B | 0.047 | 0.017 | 4.70 | 1.04 | 2.03 | 0.21 | 3.18 | 1.38 | 0.000 | 0.0000 | 4.7 | 6 |
| Example 43 | B | 0.046 | 0.016 | 4.89 | 1.09 | 1.04 | 0.11 | 2.49 | 1.08 | 0.015 | 0.0024 | 4.5 | 58 |
| Comparative Example 15 | B | 0.046 | 0.016 | 4.90 | 1.09 | 0.00 | 0.00 | 2.00 | 0.87 | 0.015 | 0.0023 | 4.5 | 21 |
| Example 44 | A | 0.047 | 0.017 | 5.87 | 1.30 | 1.04 | 0.11 | 2.49 | 1.08 | 0.015 | 0.0024 | 4.3 | 286 |
| Comparative Example 16 | A | 0.047 | 0.017 | 5.87 | 1.30 | 2.03 | 0.21 | 2.97 | 1.29 | 0.000 | 0.0000 | 4.3 | 2 |
| Example 45 | A | 0.046 | 0.016 | 9.39 | 2.09 | 2.05 | 0.21 | 10.99 | 4.78 | 0.015 | 0.0024 | 6.0 | 98 |
| Comparative Example 17 | A | 0.046 | 0.016 | 9.39 | 2.09 | 2.03 | 0.21 | 10.99 | 4.78 | 0.000 | 0.0000 | 6.0 | 50 |

(1) nm (30° C./60 sec)

From Table 2B to Table 12B, the following is apparent:

When the same azole silane coupling agent is used and the element concentrations of silicon are the same, the film-forming speed in the Examples containing an organic acid ion, an inorganic acid ion, an alkali metal ion and/or an ammonium ion, and a copper ion in addition to the azole silane coupling agent is sufficiently higher that that in the Comparative Examples not containing an organic acid ion, the Comparative Examples not containing an inorganic acid ion, the Comparative Examples not containing an alkali metal ion and an ammonium ion, and the Comparative Examples not containing a copper ion.

Even when various azole silane coupling agents are used as the azole silane coupling agent, the film-forming speed is more sufficiently improved.

Even when various ions are used as each of the organic acid ion, the inorganic acid ion, the alkali metal ion, and the ammonium ion, the film-forming speed is more sufficiently improved.

FIG. 1 shows a graph showing a relationship between the atomic concentration of silicon and the film-forming speed in Examples and Comparative Examples shown in Tables 2A and 2B.

From FIG. 1, it is apparent that the surface treatment liquid containing the organic acid ion (A) has a significantly higher film-forming speed than the surface treatment liquid not containing the organic acid ion (A).

INDUSTRIAL APPLICABILITY

The surface treatment liquid of the present invention is useful as a surface treatment liquid for metal for improving adhesiveness between a metal such as a metal circuit of a printed wiring board and a metal core material of an electric wire or a tire and a resin layer (for example, an insulating resin layer) formed on the surface of the metal.

What is claimed is:

1. A surface treatment liquid for metal comprising an azole silane coupling agent,
the surface treatment liquid further comprising:
(A) an organic acid ion having one to three acidic group(s) in one molecule;
(B) an inorganic acid ion;
(C) an alkali metal ion and/or an ammonium ion; and
(D) a copper ion.

2. The surface treatment liquid for metal according to claim 1, wherein an atomic concentration of silicon comprised in the surface treatment liquid is in a range of 0.010 to 0.50% by weight.

3. The surface treatment liquid for metal according to claim 1, wherein the organic acid ion (A) comprised in the surface treatment liquid has a concentration in a range of 1.00 to 20.0% by weight.

4. The surface treatment liquid for metal according to claim 1, wherein the inorganic acid ion (B) comprised in the surface treatment liquid has a concentration in a range of 0.10 to 10.0% by weight.

5. The surface treatment liquid for metal according to claim 1, wherein a total concentration of the alkali metal ion and/or the ammonium ion (C) comprised in the surface treatment liquid is in a range of 1.00 to 20.0% by weight.

6. The surface treatment liquid for metal according to claim 1, wherein the copper ion (D) comprised in the surface treatment liquid has a concentration in a range of 0.001 to 0.200% by weight.

7. The surface treatment liquid for metal according to claim 1, wherein the surface treatment liquid has a pH in a range of 1.0 to 12.0.

8. The surface treatment liquid for metal according to claim 1, wherein the azole silane coupling agent is one or more kinds of azole silane compounds selected from the group consisting of a monoazole silane compound, a diazole silane compound, a triazole silane compound, and a tetrazole silane compound.

9. The surface treatment liquid for metal according to claim 1, wherein the one to three acidic group(s) are a carboxyl group, a sulfonic acid group, or a mixture thereof, and
the organic acid ion (A) is an organic acid anion in which the one to three acidic group(s) are anionized.

10. The surface treatment liquid for metal according to claim 1, wherein the inorganic acid ion (B) is one or more kinds of ions selected from the group consisting of a sulfate ion, a nitrate ion, a phosphate ion, and a chloride ion.

11. The surface treatment liquid for metal according to claim 1, wherein the alkali metal ion and/or ammonium ion (C) is one or more kinds of ions selected from the group consisting of a lithium ion, a sodium ion, a potassium ion, and an ammonium ion.

12. The surface treatment liquid for metal according to claim 1, wherein the metal is a copper or a copper alloy.

13. The surface treatment liquid for metal according to claim 1, wherein the metal is a metal circuit of a printed wiring board.

14. A liquid concentrate of a surface treatment liquid for metal, comprising an azole silane coupling agent,
the liquid concentrate further comprising an organic acid ion; an inorganic acid ion; an alkali metal ion and/or an ammonium ion; and a copper ion,
wherein an atomic concentration of silicon comprised in the liquid concentrate is in a range of 0.10 to 1.00% by weight.

15. The liquid concentrate of the surface treatment liquid for metal according to claim 14, wherein the surface treatment liquid for metal according to claim 1 is produced by diluting the liquid concentrate of the surface treatment liquid for metal with water.

16. A surface treatment liquid set for metal, comprising a first liquid and a second liquid, for producing a surface treatment liquid for metal comprising an azole silane coupling agent, an organic acid ion, an inorganic acid ion, an alkali metal ion and/or an ammonium ion, and a copper ion by mutual mixing of the first liquid and the second liquid, wherein
the azole silane coupling agent is comprised in the first liquid,
the organic acid ion, the inorganic acid ion, the alkali metal ion and/or the ammonium ion, and the copper ion are each independently comprised in the first liquid and/or the second liquid, and
an atomic concentration of silicon comprised in the first liquid is in a range of 0.033 to 1.00% by weight.

17. The surface treatment liquid set for metal according to claim 16, wherein the surface treatment liquid for metal is the surface treatment liquid for metal according to claim 1.

18. A surface treatment method for metal, comprising bringing the surface treatment liquid for metal according to claim 1 into contact with a surface of a metal.

19. A method for manufacturing a printed wiring board, the method comprising bringing the surface treatment liquid for metal according to claim 1 into contact with a surface of a metal circuit of a printed wiring board to form a chemical film.

* * * * *